United States Patent
Shimakawa et al.

(10) Patent No.: US 9,053,787 B2
(45) Date of Patent: Jun. 9, 2015

(54) CROSSPOINT NONVOLATILE MEMORY DEVICE AND METHOD OF DRIVING THE SAME

(71) Applicant: Panasonic Intellectual Property Management Co., Ltd., Osaka (JP)

(72) Inventors: Kazuhiko Shimakawa, Osaka (JP); Ryotaro Azuma, Osaka (JP); Yoshikazu Katoh, Osaka (JP); Akifumi Kawahara, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/119,936

(22) PCT Filed: Mar. 27, 2013

(86) PCT No.: PCT/JP2013/002085
§ 371 (c)(1),
(2) Date: Nov. 25, 2013

(87) PCT Pub. No.: WO2013/145737
PCT Pub. Date: Oct. 3, 2013

(65) Prior Publication Data
US 2014/0078814 A1 Mar. 20, 2014

(30) Foreign Application Priority Data
Mar. 29, 2012 (JP) .................. 2012-078286

(51) Int. Cl.
*G11C 11/00* (2006.01)
*G11C 13/00* (2006.01)

(52) U.S. Cl.
CPC .......... *G11C 13/004* (2013.01); *G11C 13/0007* (2013.01); *G11C 13/0038* (2013.01); *G11C 13/0069* (2013.01); *G11C 2013/0083* (2013.01); *G11C 2213/15* (2013.01); *G11C 2013/0078* (2013.01)

(58) Field of Classification Search
USPC ................................... 365/148, 158
See application file for complete search history.

(56) References Cited

U.S. PATENT DOCUMENTS 7,283,407 B2   10/2007   Inoue et al.
8,331,177 B2   12/2012   Sasaki
8,345,466 B2    1/2013   Maejima et al.
(Continued)

FOREIGN PATENT DOCUMENTS

JP         4625510      11/2010
JP       2011-54259      3/2011
(Continued)

OTHER PUBLICATIONS

International Search Report issued in International (PCT) Application No. PCT/JP2013/002085.

*Primary Examiner* — Anthan Tran
(74) *Attorney, Agent, or Firm* — Wenderoth, Lind & Ponack, L.L.P.

(57) ABSTRACT

The nonvolatile memory device includes a control circuit that controls a sense amplification circuit and a writing circuit. The control circuit changes a value of at least one of (a) a load current and (b) a forming pulse current or a forming pulse voltage, according to a total number of sneak current paths formed by memory cells each including a variable resistance element in a second resistance state having a low resistance value except a selected memory cell in a memory cell array.

14 Claims, 25 Drawing Sheets

(56) References Cited

U.S. PATENT DOCUMENTS

| | | |
|---|---|---|
| 8,422,270 B2 * | 4/2013 | Kawabata et al. ............ 365/148 |
| 8,451,647 B2 | 5/2013 | Ishihara |
| 8,488,367 B2 | 7/2013 | Shimotori et al. |
| 2005/0169038 A1 | 8/2005 | Inoue et al. |
| 2009/0161408 A1 * | 6/2009 | Tanigami et al. ............. 365/148 |
| 2011/0032746 A1 | 2/2011 | Maejima et al. |
| 2011/0235396 A1 | 9/2011 | Sasaki |
| 2011/0235399 A1 * | 9/2011 | Sasaki ........................... 365/148 |
| 2011/0235400 A1 | 9/2011 | Shimotori et al. |
| 2011/0305070 A1 | 12/2011 | Ishihara |
| 2012/0314477 A1 * | 12/2012 | Siau .............................. 365/148 |
| 2012/0326113 A1 | 12/2012 | Yoneda et al. |
| 2013/0044534 A1 | 2/2013 | Kawai et al. |

FOREIGN PATENT DOCUMENTS

| | | |
|---|---|---|
| JP | 2011-198439 | 10/2011 |
| JP | 2011-198445 | 10/2011 |
| JP | 2011-258284 | 12/2011 |
| WO | 2011/121970 | 10/2011 |
| WO | 2011/155210 | 12/2011 |

* cited by examiner

| Sneak current path number | Gate voltage setting |
|---|---|
| 0 | LA(1) |
| 1 | LA(2) |
| 2 | LA(3) |
| 3 | LA(4) |
| 4 | LA(5) |
| 6 | LA(6) |
| 9 | LA(7) |

| Sneak current path number | Writing voltage Vw |
|---|---|
| 0 | Vw(1) |
| 1 | Vw(2) |
| 2 | Vw(3) |
| 3 | Vw(4) |
| 4 | Vw(5) |
| 6 | Vw(6) |
| 9 | Vw(7) |

Simplified schematic pattern A

▓ High resistance    ⌐ ¬ Low resistance

○ Selected memory cell a

Simplified schematic pattern C

▓ High resistance    ⌐ ¬ Low resistance

○ Selected memory cell c

CROSSPOINT NONVOLATILE MEMORY DEVICE AND METHOD OF DRIVING THE SAME

TECHNICAL FIELD

The present invention relates to crosspoint nonvolatile semiconductor memory devices having variable resistance memory elements, and particularly to forming performed by the devices.

BACKGROUND ART

In recent years, with the advance of digital technologies, electronic devices such as portable information devices and information home appliances have been increasingly sophisticated. There are therefore greater demands for a nonvolatile memory device with higher capacity, less writing power, higher writing/reading speed, and longer service life.

In order to meet the demands, refinement of a flash memory with existing floating gates has been progressed. On the other hand, as a substitute element for a flash memory, a nonvolatile memory device including memory elements each having a so-called variable resistance memory element has been researched and developed. The variable resistance memory element has a resistance value that changes according to electrical signal. The changed resistance value is kept even after turning the electrical signal off (in other words, kept in a nonvolatile manner). The variable resistance memory element is therefore capable of holding data according to the change of the resistance value.

Typical examples of the variable resistance memory element are a Magnetic Random Access Memory (MRAM), a Phase Change Random Access Memory (PRAM), a Resistec Random Access Memory (ReRAM), and the like.

One example of a structure of a nonvolatile memory device having such a variable resistance memory element is known as a crosspoint structure. In the crosspoint structure, each of memory cells is provided, between a bit line and a word line, at a corresponding crosspoint between the bit line and the word line which are arranged perpendicular to each other. Each of the memory cells includes a memory element that is a single variable resistance memory element. Or, each memory cell includes a variable resistance memory element and a switching element which are connected in series. The switching element, such as a diode, has nonlinear characteristics. An electrode of the memory element is connected to a word line, and the other electrode is connected to a bit line. The crosspoint structure has characteristics of being more suitable for large-scale integration than a so-called 1T1R (1 transistor and 1 resistance) structure where a variable resistance memory element is connected to a bit line via an access transistor.

In the crosspoint structure, a plurality of memory cells are arranged in an array to form a crosspoint cell array. In the crosspoint structure, in order to detect (read) a resistance value of a memory element included in a target memory cell, a reading voltage is applied to a corresponding bit line and a corresponding word line. When the reading voltage is applied, a current flows in the target memory cell to be detected (target to be read), but a current also flows via the other memory cells (memory cells other than the target memory cell) connected in parallel to the target memory cell along upper and lower lines, namely, a bit line and a word line. In the description, the "current (that) also flows via the other memory cells" is referred to as a sneak current.

The sneak current changes according to a state of pieces of data stored in a crosspoint cell array (namely, resistance values of memory elements included in all of memory cells in the crosspoint cell array to which a target memory cell to be detected belongs, and distribution of the resistance values). Therefore, a current detected in reading includes a sneak current having a value that constantly varies. Such a sneak current prevents accurate detection of a resistance value of a memory element included in a target memory cell to be read. Patent Literature 1 (PLT1) discloses a semiconductor memory device having a structure for preventing a sneak current from decreasing a detection sensitivity of a resistance value of a memory element included in a memory cell.

It has been generally known that an operation called forming is necessary to cause a variable resistance memory element to be in the state where a resistance of the variable resistance memory element is reversibly changeable. A technique relating to the forming is disclosed in Patent Literature 2 (PLT 2).

Furthermore, as a means for causing a crosspoint semiconductor memory device to perform correct forming, Patent Literature 3 discloses a structure including a detection circuit that detects a leak current flowing in a word line WL in performing forming. Patent Literature 3 (PLT 3) discloses that, in performing forming, current supply is performed to supply a constant current to a bit line BL, and at the same time, a compensating current having the same current value as that of the leak current is supplied to the bit line BL based on the leak current detected by the detection circuit.

CITATION LIST

Patent Literatures

[PTL1] Japanese Patent No. 4625510
[PTL2] PCT International Publication No. 2011/121970
[PTL3] Japanese Unexamined Patent Application Publication No. 2011-198445

SUMMARY OF INVENTION

Technical Problem

However, further improvement of stability has been demanded in the conventional forming methods.

The present invention solves the above conventional problem. An object of the present invention is to provide a crosspoint nonvolatile memory device and a forming method used by the device which are capable of achieving stable forming.

Solution to Problem

In accordance with an aspect of the present invention for achieving the object, there is provided a crosspoint nonvolatile memory device comprising: a plurality of word lines parallel to each other on a first plane; a plurality of bit lines parallel to each other on a second plane parallel to the first plane, the bit lines three-dimensionally crossing the word lines; a crosspoint memory cell array including memory cells arranged in rows and columns at respective three-dimensional crosspoints between the word lines and the bit lines, each of the memory cells including a variable resistance element changeable between two resistance states which are a first resistance state and a second resistance state that has a lower resistance value than a resistance value of the first resistance state; a word line selector that selects a world line from the word lines; a bit line selector that selects a bit line from the bit lines; a writing circuit that supplies a writing current or a writing voltage to change a resistance state of a variable resistance element in a selected memory cell, the selected memory cell being selected by selecting the bit line by the bit line selector and selecting the word line by the word line selector; a sense amplification circuit that supplies a load current to the selected memory cell to read the resistance state of the variable resistance element in the selected memory cell; and a control circuit that controls the sense amplification circuit and the writing circuit, wherein, in the crosspoint memory cell array, (A) at least one memory cell including a variable resistance element in the second resistance state among memory cells connected to the bit line selected by the bit line selector except the selected memory cell is determined as at least one first memory cell, and (B) at least one memory cell including a variable resistance element in the second resistance state among memory cells connected to the word line selected by the word line selector except the selected memory cell is determined as at least one second memory cell, and the control circuit changes the value of the at least one of (a) the writing current or the writing voltage and (b) the load current, in proportion to the total number of the memory cell in the second resistance state among memory cells each located at a crosspoint between a word line connected to a corresponding one of the at least one first memory cell and a bit line connected to a corresponding one of the at least one second memory cell.

These general and specific aspects may be implemented using a system, a method, an integrated circuit, a computer program, or a computer-readable recording medium such as a Compact Disc Read Only Memory (CD-ROM), or any combination of systems, methods, integrated circuits, computer programs, or computer-readable recording media.

Advantageous Effects of Invention

The crosspoint nonvolatile semiconductor memory device and the method of driving the crosspoint nonvolatile semiconductor memory device according to the present invention are capable of achieving stable forming.

DESCRIPTION OF EMBODIMENT

Prior to the description of the present embodiment according to the present invention, how the present invention have been conceived is described.

The inventions have found the following problems in the forming performed by crosspoint semiconductor memory devices as described in "Background Art".

Figure 18:
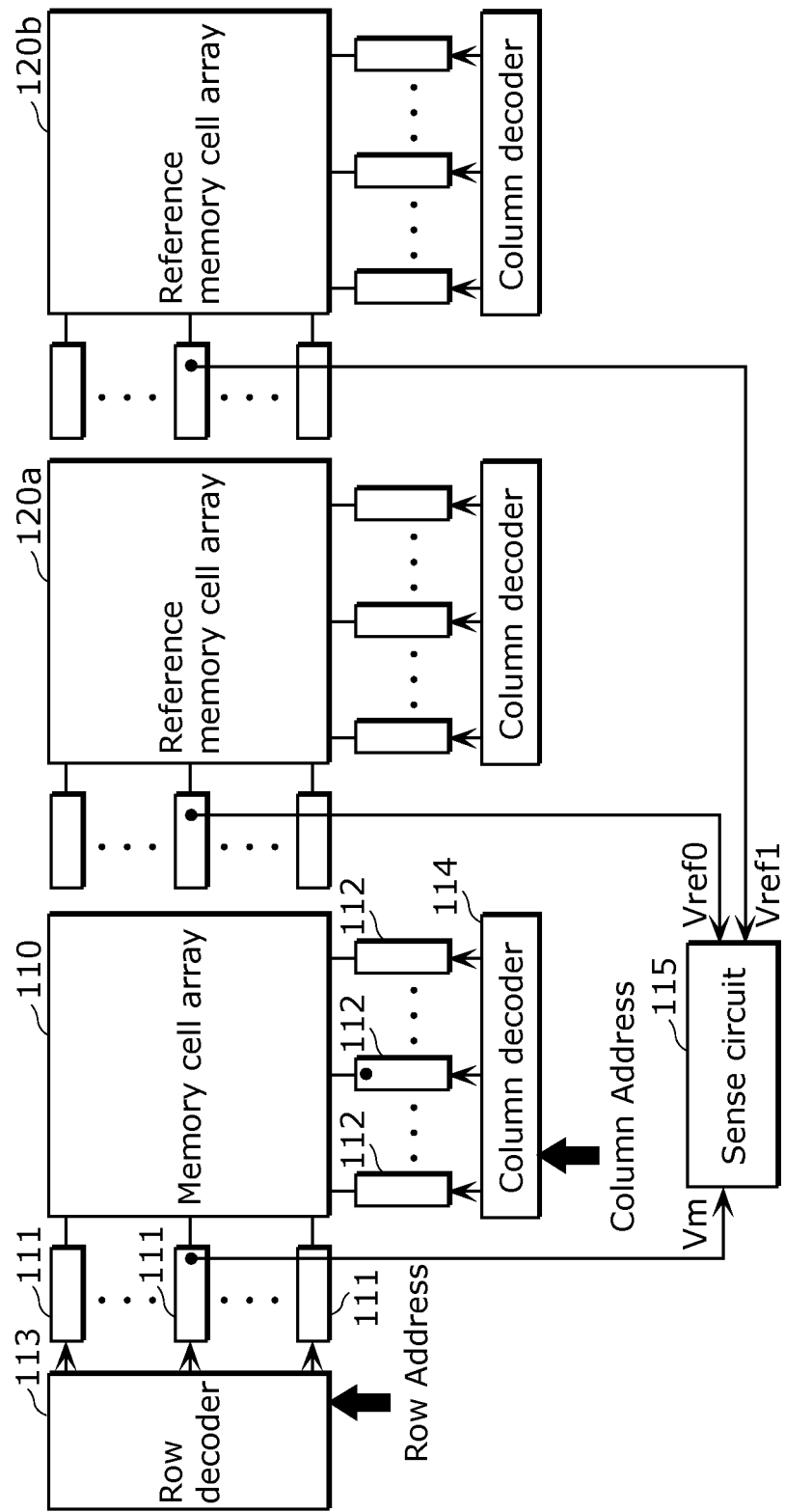
FIG. 18 is a block diagram showing a structure of a main part of a semiconductor memory device disclosed in Patent Literature 1.

FIG. 18 is a block diagram showing a structure of a main part of the semiconductor memory device disclosed in Patent Literature 1.

The semiconductor memory device includes: a crosspoint memory cell array 110; a data line drive circuit 111 that drives data lines individually; a bit line drive circuit 112 that drives bit lines individually; a column decoder 113 that selects, from a plurality of data lines, a data line to be connected to a selected memory cell from which data is to be read; and a column decoder 114 that selects, from a plurality of bit lines, a bit line to be connected to the selected memory cell.

The semiconductor memory device further includes two reference memory cell arrays 120a and 120b for reference voltage generation. Each of the reference memory cell arrays 120a and 120b has the same size as that of the memory cell array 110, and includes the same memory cells as included in the memory cell array 110. The semiconductor memory device also includes a sense circuit 115. The sense circuit 115 generates reference voltage levels Vref0 and Vref1 from output voltages of the reference memory cell arrays 120a and 120b. The sense circuit 115 also generates a reading voltage level Vm from a voltage level of a selected data line of the memory cell array 110. The sense circuit 115 compares the reading voltage level to the reference voltage level to examine a memory state (resistance state) of the selected memory cell.

Figure 19A:
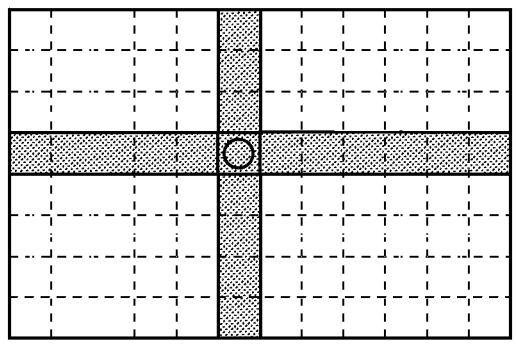
FIG. 19A is a diagram showing an example of data set to a reference memory array by the semiconductor memory device disclosed in Patent Literature 1.
Figure 19B:
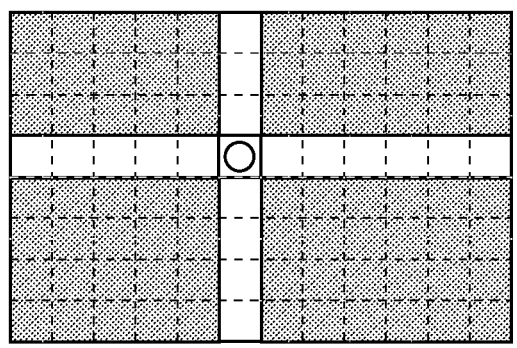
FIG. 19B is a diagram showing an example of data set to a reference memory array by the semiconductor memory device disclosed in Patent Literature 1.

For the reference memory cell array 120a, a state of a current (current state) is set so that a current flowing in a selected-row selection line of a high-resistance memory cell that is a selected memory cell having a high resistance state is in a maximum state depending on a distribution pattern of resistance states of non-selected memory cells of the memory cell array. On the other hand, for the reference memory cell array 120b, a current state is set so that a current flowing in a selected-row selection line of a low-resistance memory cell that is a selected memory cell having a low resistance state is in a minimum state depending on a distribution pattern of resistance states of non-selected memory cells of the memory cell array. The sense circuit 115 compares a current flowing in the selected memory cell to a current in an intermediate state between the maximum state and the minimum state, thereby detecting a resistance state of the selected memory cell FIGS. 19A and 19B are diagrams showing examples of data set to the reference memory cell arrays 120a and 120b, respectively. FIG. 19A shows a pattern A set to the reference memory cell array 120a, while FIG. 19B shows a pattern C set to the reference memory cell array 120b In this case, the reference memory cell array 120a achieves the first current state where a current flowing in a selected data line when reading data from a selected memory cell in a high resistance state is in a maximum state depending on a distribution pattern of electrical resistance states of the other non-selected memory cells. Therefore, the reference memory cell array 120a functions as a first reference current generation circuit. On the other hand, the reference memory cell array 120b achieves the second current state where a current flowing in a selected data line when reading data from a selected memory cell in a low resistance state is in a minimum state depending on a distribution pattern of electrical resistance states of the other non-selected memory cells. Therefore, the reference memory cell array 120b functions as a second reference current generation circuit.

In a crosspoint memory cell array, an amount of a sneak current changes according to writing data. As shown in a pattern A in FIG. 19A, when reading from a high-resistance memory cell at a position where a row of high-resistance memory cells and a column of high-resistance memory cells cross each other, the sneak current is the largest and a read current is also the largest. On the other hand, when reading from a low-resistance memory cell at a position where a row of low-resistance memory cells and a column of low-resistance memory cells cross each other, a read current is the smallest. Therefore, a high-resistance write pattern (pattern A) considered as resulting in the largest current flowing in the selected data line and a low-resistance write pattern (pattern C) considered as resulting in the smallest current flowing in the selected data line are prepared. A resistance state of the selected memory cell is detected based on a medium state of the two patterns, thereby achieving stable reading operation.

However, the structure shown in FIG. 18 needs to prepare a plurality of reference cell arrays each having the same size as that of the memory cell array, and there is therefore a problem of increasing a chip size.

From another viewpoint, the following problem is considered for a variable resistance memory element.

As disclosed in Patent Literature 2, a variable resistance memory element needs to perform at least one filament forming operation called forming after manufacturing. The forming allows resistance to reversibly change. A resistance value of a variable resistance memory element in an initial state before forming is in a high resistance state (hereinafter, referred to as a super high resistance state) that is higher than a normal high resistance state. Then, while a resistance value of a target memory cell is kept monitored, a predetermined forming pulse is appropriately applied to the target memory cell according to the resistance state.

Here, in a crosspoint memory device, as the number of memory cells for which forming has already been performed (hereinafter, referred to also as "forming-performed memory cells") is increased with the progress of the forming, the number of memory cells each having a lower resistance value than an resistance value in an initial state is increased. As a result, a sneak current is gradually increased. In order to perform forming by appropriately applying a predetermined forming pulse according to a resistance state of a target memory cell while a resistance value of the target memory cell is monitored, it is necessary to distinguish a sneak current amount that constantly varies from a current for the forming on the target memory cell, and thereby makes a forming determination. However, such current distinction is not easy, and it is therefore difficult to achieve stable forming.

Here, it is considered that this problem is solved by applying the technique disclosed in Patent Literature 1 to forming. More specifically, it is considered that a state where forming has not been performed on all memory cells in one of the reference memory cell arrays is achieved, and, on the other hand, a state where forming has not been performed on only one memory cell is achieved, and then, a forming determination is made with reference to an intermediate state of these states. However, as described earlier, this method causes a problem of increasing a chip size.

Patent Literature 3 discloses a technique of detecting a leak current in forming in a crosspoint semiconductor memory device and supplying a compensating current corresponding to the leak current, thereby accurately performing forming operation. However, the leak current in the above case is a current flowing in a selected memory cell in a super high resistance state for which forming is to be performed. Therefore, Patent Literature 3 does not mention a sneak current flowing in a non-selected memory cell.

In order to address the above circumstances, the inventors have examined a crosspoint nonvolatile memory device and a method of driving the crosspoint nonvolatile memory device which are capable of correctly performing forming under influence of a sneak current, and eventually arrived at the present invention, it should be noted that the above description has been given to facilitate the understanding of the embodiment of the present invention described below, and that the present invention is not limited to the above description.

In accordance with an aspect of the present invention for achieving the object, there is provided a crosspoint nonvolatile memory device including: a plurality of word lines parallel to each other on a first plane; a plurality of bit lines parallel to each other on a second plane parallel to the first plane, the bit lines three-dimensionally crossing the word lines; a crosspoint memory cell array including memory cells arranged in rows and columns at respective three-dimensional crosspoints between the word lines and the bit lines, each of the memory cells including a variable resistance element changeable between two resistance states which are a first resistance state and a second resistance state that has a lower resistance value than a resistance value of the first resistance state; a word line selector that selects a world line from the word lines; a bit line selector that selects a bit line from the bit lines; a writing circuit that supplies a writing current or a writing voltage to change a resistance state of a variable resistance element in a selected memory cell, the selected memory cell being selected by selecting the bit line by the bit line selector and selecting the word line by the word line selector; a sense amplification circuit that supplies a load current to the selected memory cell to read the resistance state of the variable resistance element in the selected memory cell; and a control circuit that controls the sense amplification circuit and the writing circuit, wherein, in the crosspoint memory cell array, (A) at least one memory cell including a variable resistance element in the second resistance state among memory cells connected to the bit line selected by the bit line selector except the selected memory cell is determined as at least one first memory cell, and (B) at least one memory cell including a variable resistance element in the second resistance state among memory cells connected to the word line selected by the word line selector except the selected memory cell is determined as at least one second memory cell, and the control circuit changes the value of the at least one of (a) the writing current or the writing voltage and (b) the load current, in proportion to the total number of the memory cell in the second resistance state among memory cells each located at a crosspoint between a word line connected to a corresponding one of the at least one first memory cell and a bit line connected to a corresponding one of the at least one second memory cell.

It is further possible that in an initial state after manufacturing the variable resistance element, the variable resistance element is in the first resistance state, and after forming is performed, the variable resistance element is changed from the initial state to the second resistance state where the variable resistance element is reversibly changeable between a low resistance state and a high resistance state that has a higher resistance value than a resistance value of the low resistance state, that the writing current or the writing voltage is a forming pulse used in the forming on the variable resistance element in the selected memory cell, and that the load current is a current for checking whether application of the forming pulse causes the variable resistance element in the selected memory cell to be in the second resistance state. It is still further possible that the variable resistance element is reversibly changeable between the first resistance state and the second resistance state, that the writing current or the writing voltage is an electrical signal that causes the variable resistance element in the selected memory cell to be reversibly changeable between the first resistance state and the second resistance state, and that the load current is a current for checking whether the variable resistance element in the selected memory cell is in the first resistance state or in the second resistance state.

It is still further possible that each of the memory cells includes the variable resistance element and a diode element which are connected in series with each other, the diode element comprising nitrogen-deficient silicon nitride.

In accordance with the above aspect, a load current (read current) for a forming determination is changed according to a total number of memory cells in the second resistance state among memory cells each located at a crosspoint between a word line connected to a corresponding one of the at least one first memory cell and a bit line connected to a corresponding one of the at least one second memory cell, in other words, according to a sneak current path number. Therefore, the load current can be supplied to the selected memory cell, by compensating an appropriate sneak current amount. As a result, in the forming process performed on the selected memory cell in the initial state, it is possible to make the forming determination on the selected memory cell by excluding influence of the sneak current. Therefore, stable forming can be achieved.

In addition, a writing current or a writing voltage (forming pulse) is changed according to a sneak current path number. Therefore, the forming pulse can be applied to the selected memory cell, by compensating an appropriate sneak current amount. As a result, in the forming process, it is possible to perform forming on the selected memory cell by excluding influence of a sneak current. Therefore, stable forming can be achieved.

Furthermore, a writing current or a writing voltage (electrical signal) for changing a resistance state of a variable resistance element is changed according to a sneak current path number. Therefore, the electrical signal can be supplied to the selected memory cell, by compensating an appropriate sneak current amount. As a result, it is possible to change a resistance state of the selected memory cell by excluding influence of a sneak current. Therefore, data writing can be stably performed.

Moreover, a load current (read current) for reading a resistance state of a variable resistance element is changed according to a sneak current path number. Therefore, the load signal can be supplied to the selected memory cell, by compensating an appropriate sneak current amount. As a result, it is possible to make a determination for a resistance state of the selected memory cell by excluding influence of a sneak current. Therefore, data reading can be stably performed.

It is still further possible that the control circuit performs the changing for the load current, and that the sense amplification circuit includes a load current source that selects a load current from among load currents having different current amounts and supplies the selected load current to the bit line selected by the bit line selector as the load CURRENT changed by the control circuit, the sense amplification circuit (i) outputting a first logical value when a current amount flowing into the selected bit line is more than a reference current amount and (ii) outputting a second logical value when the current amount is less than the reference current amount.

It is still further possible that the sense amplification circuit includes a differential amplifier that (i) compares a voltage at the selected bit line to a reference voltage, and (ii-1) outputs the second logical value when the voltage at the selected bit line is higher than the reference voltage and (ii-2) outputs the first logical value when the voltage is lower than the reference voltage, and that the sense amplification circuit outputs: the first logical value, when the variable resistance element in the selected memory cell is in the second resistance state and the load current changed by the control circuit is supplied to the selected memory cell, and the second logical value, when the variable resistance element in the selected memory cell is in the first resistance state and the load current changed by the control circuit is supplied to the selected memory cell.

It is still further possible that the load current source includes a Metal Oxide Semiconductor (MOS) transistor, that the crosspoint nonvolatile memory device further comprises a variable voltage source that is electrically connected to a gate terminal of the MOS transistor and that selects a voltage from among voltages having different voltage values and applies the selected voltage to the gate terminal, that the load current source selects the load current to be supplied, from among at least a first load current, a second load current, and a third load current having a current amount between a current amount of the first load current and a current amount of the second load current, and that (i) when the load current source is to supply the second load current, the control circuit adjusts a value of the selected voltage applied from the variable voltage source to cause an output current of the MOS transistor to be more than an output current of the MOS transistor in a case where the load current source supplies the third load current, and (ii) when the load current source is to supply the third load current, the control circuit adjusts the value of the selected voltage to cause the output current of the MOS transistor to be more than an output current of the MOS transistor in a case where the load current source supplies the first load current. It is still further possible that the load current source includes a Metal Oxide Semiconductor (MOS) transistor, that the crosspoint nonvolatile memory device is electrically connected to a gate terminal of the MOS transistor, and includes an external voltage application terminal that receives a voltage selected from among various different voltages, that the load current source selects the load current to be supplied, from among at least a first load current, a second load current, and a third load current having a current amount between a current amount of the first load current and a current amount of the second load current, and that (i) when the load current source is to supply the second load current, the control circuit adjusts a value of the voltage applied to the external voltage application terminal to cause an output current of the MOS transistor to be more than an output current of the MOS transistor in a case where the load current source supplies the third load current, and (ii) when the load current source is to supply the third load current, the control circuit adjusts the value of the voltage to cause the output current of the MOS transistor to be more than an output current of the MOS transistor in a case where the load current source supplies the first load current.

In accordance with the above aspect, a capability of the load current source for driving current is set high until an appropriate sneak current amount is compensated in the state before forming, and the current driving capability is used to make a forming determination for the selected memory cell. As a result, the forming determination can be stably performed and stable forming can be achieved.

In addition, a capability of the load current source for driving current is set high until an appropriate sneak current amount is compensated in the state before resistance change, and the current driving capability is used to make a forming determination for resistance change of the selected memory cell. As a result, the determination for resistance change can be stably performed and data reading can be stably performed.

In accordance with another aspect of the present invention, there is provided a method of driving a crosspoint nonvolatile memory device, the crosspoint nonvolatile memory device including: a plurality of word lines parallel to each other on a first plane; a plurality of bit lines parallel to each other on a second plane parallel to the first plane, the bit lines three-dimensionally crossing the word lines; a crosspoint memory cell array including memory cells arranged in rows and columns at respective three-dimensional crosspoints between the word lines and the bit lines, each of the memory cells including a variable resistance element changeable between two resistance states which are a first resistance state and a second resistance state that has a lower resistance value than a resistance value of the first resistance state; a word line selector that selects a world line from the word lines; a bit line selector that selects a bit line from the bit lines; a writing circuit that supplies a writing current or a writing voltage to change a resistance state of a variable resistance element in a selected memory cell, the selected memory cell being selected by selecting the bit line by the bit line selector and selecting the word line by the word line selector; and a sense amplification circuit that supplies a load current to the selected memory cell to read the resistance state of the variable resistance element in the selected memory cell, in the crosspoint memory cell array, (A) at least one memory cell including a variable resistance element in the second resistance state among memory cells connected to the bit line selected by the bit line selector except the selected memory cell is determined as at least one first memory cell, and (B) at least one memory cell including a variable resistance element in the second resistance state among memory cells connected to the word line selected by the word line selector except the selected memory cell is determined as at least one second memory cell, the method of driving the crosspoint nonvolatile memory device, including changing the value of the at least one of (a) the writing current or the writing voltage and (b) the load current, in proportion to the total number of the memory cell in the second resistance state among memory cells each located at a crosspoint between a word line connected to a corresponding one of the at least one first memory cell and a bit line connected to a corresponding one of the at least one second memory cell.

It is further possible that the sense amplification circuit includes a load current source that selects a load current from among load currents having different current amounts and supplies the selected load current to the bit line selected by the bit line selector, the sense amplification circuit (i) outputting a first logical value when a current amount flowing into the selected bit line is more than a reference current amount and (ii) outputting a second logical value when the current amount is less than the reference current amount, in the changing of the value, the changing is performed for the load current to generate a changed load current, and the method further including: supplying the changed load current to the selected memory cell and checking whether or not an output of the sense amplification circuit is the second logical value; supplying, after the supplying of the changed load current, the writing current or the writing voltage to the selected memory cell; and supplying the changed load current to the selected memory cell and reading the resistance state of the variable resistance element in the selected memory cell, after the supplying of the writing current or the writing voltage, wherein in the supplying of the changed load current after the supplying of the writing current or the writing voltage, when the output of the sense amplification circuit is the first logical value, it is determined that the resistance state of the variable resistance element in the selected memory cell has been changed, and the supplying of the writing current or the writing voltage is terminated, and when the output of the sense amplification circuit is the second logical value, it is determined that the resistance state of the variable resistance element in the selected memory cell has not been changed, and the supplying of the writing current or the writing voltage is performed again. It is still further possible that the sense amplification circuit includes a load current source, and (i) outputs a first logical value when a current amount flowing into the bit line selected by the bit line selector is more than a reference current amount and (ii) outputs a second logical value when the current amount is less than the reference current amount, in the changing of the value, the changing is performed for the writing current or the writing voltage to generate the changed writing current or the changed writing voltage, the method including: supplying the load current to the selected memory cell and checking whether or not the output of the sense amplification circuit is the second logical value; supplying, after the supplying of the load current, the changed writing current or the changed writing voltage to the selected memory cell; and supplying, after the supplying of the changed writing current or the changed writing voltage, the load current to the selected memory cell and reads the resistance state of the variable resistance element in the selected memory cell, wherein in the supplying of the load current after the supplying of the changed writing current or the changed writing voltage, when the output of the sense amplification circuit is the first logical value, it is determined that the resistance state of the variable resistance element in the selected memory cell has been changed, and the supplying of the changed writing current or the changed writing voltage is terminated, and when the output of the sense amplification circuit is the second logical value, it is determined that the resistance state of the variable resistance element in the selected memory cell has not been changed, and the supplying of the changed writing current or the changed writing voltage is performed again.

It is also possible that in an initial state after manufacturing the variable resistance element, the variable resistance element is in the first resistance state, and after forming is performed, the variable resistance element is changed from the initial state to the second resistance state where the variable resistance element is reversibly changeable between a low resistance state and a high resistance state that has a higher resistance value than a resistance value of the low resistance state, that the writing current or the writing voltage is a forming pulse used in the forming on the variable resistance element in the selected memory cell, and that the load current is a current for checking whether application of the forming pulse causes the variable resistance element in the selected memory cell to be in the second resistance state. It is still further possible that the variable resistance element is reversibly changeable between the first resistance state and the second resistance state, that the writing current or the writing voltage is an electrical signal that causes the variable resistance element in the selected memory cell to be reversibly changeable between the first resistance state and the second resistance state, and that the load current is a current for checking whether the variable resistance element in the selected memory cell is in the first resistance state or in the second resistance state.

It is still further possible that each of the memory cells includes the variable resistance element and a diode element which are connected in series with each other, the diode element comprising a nitrogen-deficient silicon nitride film.

According to the above aspect, stable forming can be achieved. It is also possible to achieve stable data writing and stable data reading.

Hereinafter, certain exemplary embodiment is described in greater detail with reference to the accompanying Drawings. The exemplary embodiment described below shows a specific example of the present invention. The numerical values, shapes, materials, structural elements, the arrangement and connection of the structural elements, steps, the processing order of the steps etc. shown in the following exemplary embodiment are mere examples, and therefore do not limit the scope of the appended Claims and their equivalents. Therefore, among the structural elements in the following exemplary embodiment, structural elements not recited in any one of the independent claims are described as arbitrary structural elements. Furthermore, in the drawings, the elements that represent substantially identical structures, steps, and effects are assigned with the same reference numeral.

It should be noted in the description that the number of memory cells included in a memory cell array is schematically shown to make the principal easily understood, but the effects are not changed even if the number of memory cells is increased.

It should also be noted that the description is given only for a single-layered crosspoint cell array with reference to the drawings, but the present invention is not limited only to the single-layered crosspoint cell array. If the structure of the present invention is applied to each of single-layered crosspoint cell arrays included in a multi-layered crosspoint cell array, the same effects can be obtained.

[Structure of Crosspoint Nonvolatile Memory Device]

Figure 1A:
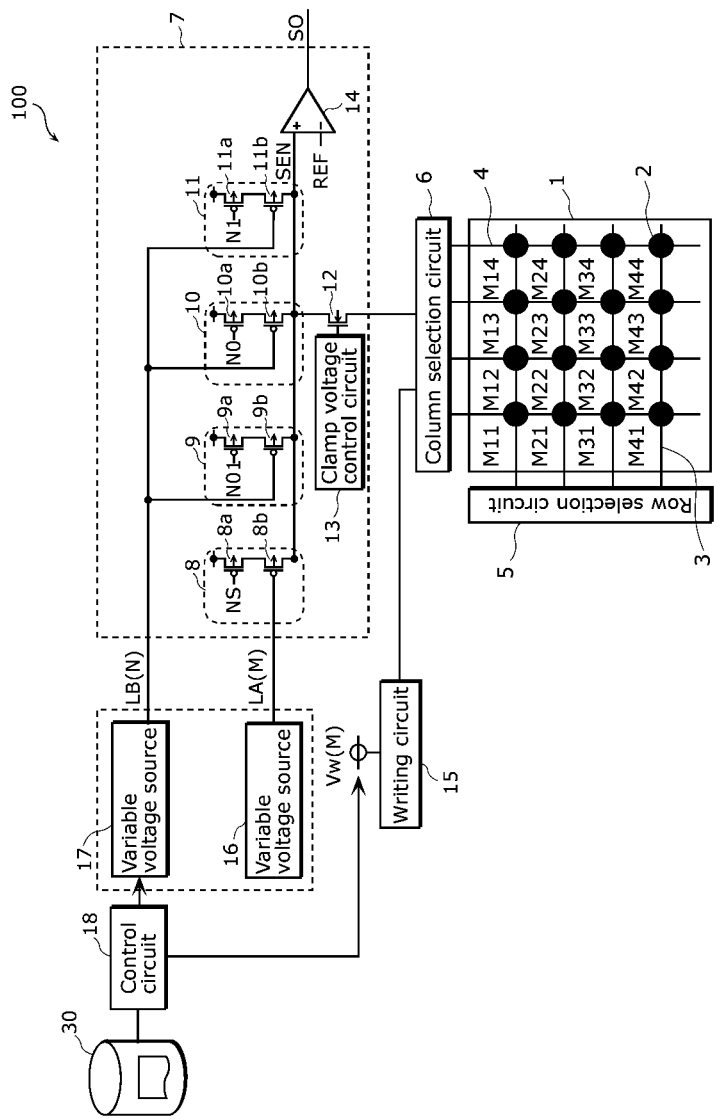
FIG. 1A is a circuit diagram showing a structure of a crosspoint nonvolatile memory device according to an embodiment of the present invention.

FIG. 1A is a circuit diagram showing a structure of a crosspoint nonvolatile memory device 100 according to an embodiment of the present invention.

The nonvolatile memory device 100 includes: a plurality of word lines 3; a plurality of bit lines 4; and a memory cell array (crosspoint memory cell array) 1. The word lines 3 are arranged in parallel to one another on a first plane. The bit lines 4 are arranged in parallel to one another on a second plane parallel to the first plane. The bit lines 4 three-dimensionally cross the word lines 3. In the memory cell array (crosspoint memory cell array) 1, memory cells 2 are arranged in rows and columns. The memory cells 2 are provided at the respective three-dimensional crosspoints between the word lines 3 and the bit lines 4. Each of the memory cells 2 includes a variable resistance element that has two resistance states: a first resistance state that is a super high resistance state, and a second resistance state that is high or low resistance state having a resistance value lower than that of the super resistance value. The nonvolatile memory device 100 further includes a row selection circuit 5 and a column selection circuit 6. The row selection circuit 5 is a word line selector that selects one of the word lines 3. The column selection circuit 6 is a bit line selector that selects one of the bit lines 4. The nonvolatile memory device 100 still further includes a writing circuit 15, a sense amplification circuit (SA) 7, and a control circuit 18. The writing circuit 15 applies a forming pulse for forming to a memory cell 2 selected by selecting a bit line 4 by the row selection circuit 5 and a word line 3 by the column selection circuit 6, so that the forming pulse as a write current causes a change of a resistance state of a variable resistance element in the selected memory cell 2. The sense amplification circuit (SA) 7 supplies a load current to the selected memory cell 2, so that the load current as a read current causes reading of the resistance state of the variable resistance element in the selected memory cell 2. The control circuit 18 controls the sense amplification circuit 7 and the writing circuit 15. The control circuit 18 changes (sets) a value (absolute value) of at least one of the forming pulse and the load current, according to the number and positions of memory cells 2 each including a variable resistance element in the second resistance state (a high resistance state or a low resistance state) except the selected memory cell 2 in the memory cell array 1.

In the memory cell array 1, (A) any memory cell 2 including a variable resistance element in the second resistance state among memory cells 2 connected to a selected bit line 4 except a selected memory cell 2 is determined as a first memory cell, and (B) any memory cell 2 including a variable resistance element in the second resistance state among memory cells 2 connected to a selected word line 3 except a selected memory cell 2 is determined as a second memory cell. Here, the control circuit 18 changes a value of at least one of the forming pulse and the load current, in proportion to the number (sneak current path number) of memory cells in the second resistance state among memory cells 2 each located at a crosspoint between the word line 3 connected to the first memory cells and the bit line 4 connected to the second memory cells, so that the value becomes greater as the sneak current path number is larger.

The variable resistance element is in the super high resistance state in an initial state after manufacturing. After forming, the variable resistance element is changed from the initial state to the second resistance state where a resistance value is reversibly changeable between a low resistance state and a high resistance state in which the resistance value is higher than in the low resistance state. The forming pulse is a pulse applied to perform forming on a variable resistance element in a selected memory cell 2. The load current is a current that is supplied as a read current to the selected memory cell 2 to check that the application of the forming pulse has changed the variable resistance element in the selected memory cell 2 from the super high resistance state to one of the high resistance state and the low resistance state.

The control circuit 18 controls the above-described changes of the load current. The sense amplification circuit 7 includes a sneak current compensating load current supply unit 8 that is a load current source that selects a load current from among load currents having different current amounts and supplies the selected load current to the selected bit line 4 as the changed load current. If an amount of a current flowing into the selected bit line 4 is greater than a reference current amount, the sneak current compensating load current supply unit 8 outputs 'L' level as a first logical value. On the other hand, if the current amount is less than the reference current amount, then the sneak current compensating load current supply unit 8 outputs 'H' level as a second logical value.

When a memory cell 2 is selected, before application of a forming pulse to the selected memory cell 2, the control circuit 18 sets a current amount of the load current supplied from the sneak current compensating load current supply unit 8 to a predetermined current amount that causes the sense amplification circuit 7 to output 'H' level. After the setting, the control circuit 18 controls the sneak current compensating load current supply unit 8 to supply the load current having the predetermined current amount, and controls the forming pulse to be applied to the predetermined memory cell 2 until the sense amplification circuit 7 outputs 'L' level.

Here, the sense amplification circuit 7 includes a difference amplifier 14. The difference amplifier 14 compares a voltage at the bit line 4 selected by the column selection circuit 6 to a voltage as a reference (reference voltage REF). If the voltage at the bit line 4 selected by the column selection circuit 6 is higher than the reference voltage, the difference amplifier 14 outputs 'H' level. On the other hand, if the voltage at the bit line 4 selected by the column selection circuit 6 is lower than the reference voltage, the difference amplifier 14 outputs 'L' level. If a changed predetermined load current is supplied to a selected memory cell 2 when a variable resistance element in the selected memory cell 2 is in the second resistance state, the sense amplification circuit 7 outputs 'L' level. If a changed predetermined load current is supplied to a selected memory cell 2 when a variable resistance element in the selected memory cell 2 is in the first resistance state (super high resistance state), the sense amplification circuit 7 outputs 'H' level.

The sneak current compensating load current supply unit 8 selectively switches the load current between a first load current and a second load current that has a more current amount than a current amount of the first load current, and supplies the selected load current to a selected bit line 4. Furthermore, in the state where forming has not yet been performed on all of the memory cells 2 in the memory cell array 1, when a predetermined memory cell 2 is selected, before applying a forming pulse to the predetermined memory cell 2, the sense amplification circuit 7 outputs 'H' level if the load current of the sneak current compensating load current supply unit 8 is any one of the first load current and the second load current. Furthermore, in the state where forming has already been performed on all of the memory cells 2 in the memory cell array 1, when a predetermined memory cell 2 is selected, before applying a forming pulse to the predetermined memory cell 2, the sense amplification circuit 7 outputs a 'L' level if the load current of the sneak current compensating load current supply unit 8 is the first load current, and outputs an 'H' level if the load current is the second load current.

The sneak current compensating load current supply unit 8 includes a P-type Metal Oxide Semiconductor (MOS) transistor 8b. The nonvolatile memory device 100 further includes a variable voltage source 16. The variable voltage source 16 is connected to a gate terminal of the P-type MOS transistor 8b. The variable voltage source 16 selects a voltage among voltages having different voltage values and applies the selected voltage to the gate terminal of the P-type MOS transistor 8b. The sneak current compensating load current supply unit 8 selects the load current to be supplied, from among at least a first load current, a second load current, and a third load current. The third load current has a current amount between a current amount of the first load current and a current amount of the second load current. The control circuit 18 adjusts the voltage value of the variable voltage source 16. More specifically, when the sneak current compensating load current supply unit 8 is to supply the second load current, the control circuit 18 adjusts a value of the voltage applied from the variable voltage source 16 to cause an output current of the P-type MOS transistor 8b to be more than that in the case where the sneak current compensating load current supply unit 8 supplies the third load current. When the sneak current compensating load current supply unit 8 is to supply the third load current, the control circuit 18 adjusts the value of the voltage applied from the variable voltage source 16 to cause the output current of the P-type MOS transistor 8b to be more than that in the case where the sneak current compensating load current supply unit 8 supplies the first load current.

The following describes the nonvolatile memory device 100 according to the present embodiment in more detail. The nonvolatile memory device 100 includes a memory cell array (crosspoint memory cell array 1), a row selection circuit 5, a column selection circuit 6, a sense amplification circuit 7, a writing circuit 15, variable voltage sources 16 and 17, a control circuit 18, and a storage unit (memory) 30. It should be noted that the storage unit 30 may be provided on a chip separate from the nonvolatile memory device 100, or included in the control circuit 18.

In the memory cell array 1, memory cells 2 are arranged in rows and columns. The memory cells 2 are arranged at respective crosspoints between the word lines 3 and the bit lines 4.

It should be noted that, in FIG. 1A, the memory cell array 1 is shown simply as a 4×4 array. Matrix symbols M11 to M44 represent respective arrangement positions of the memory cells 2. Hereinafter, even if the matrix symbols are not assigned to the memory cell array 1 in the corresponding figure, the description is given with reference to the matrix symbols in FIG. 1A.

The row selection circuit 5 selects and controls one of the plurality of word lines 3. The column selection circuit 6 selects and controls one of the plurality of bit lines 4.

According to a current amount flowing in a bit line selected by the column selection circuit 6, the sense amplification circuit 7 outputs data "1" or data "0" that is a logical value, as a determination signal SO. In the sense amplification circuit 7, the sneak current compensating load current supply unit 8, a reading current detection load current supply unit 9, a data "0" verification load current supply unit 10, and a data "1" verification load current supply unit 11 are connected in parallel. These four load current supply units are connected to the column selection circuit 6 via a clamp N-type MOS transistor (bit line clamp transistor) 12. They are also connected to one of input terminals of the differential amplifier 14.

The sneak current compensating load current supply unit 8 is a current source that supplies a current having a variable output amount. In the sneak current compensating load current supply unit 8, a P-type MOS transistor 8a and a P-type MOS transistor 8b are connected in series with each other. The sneak current compensating load current supply unit 8 is connected to a drain of the clamp N-type MOS transistor 12. To a gate of the P-type MOS transistor 8a, a selection signal NS is supplied. The selection signal NS indicates whether or not to select the sneak current compensating load current supply unit 8. On the other hand, to a gate of the P-type MOS transistor 8b, a load current control voltage LA(M), where M is a natural number, is supplied. A voltage value of the load current control voltage LA(M) can adjust a current output amount of the sneak current compensating load current supply unit 8.

The reading current detection load current supply unit 9 is a current source that supplies a current having a variable output amount. In the reading current detection load current supply unit 9, a P-type MOS transistor 9a and a P-type MOS transistor 9b are connected in series with each other. The reading current detection load current supply unit 9 is connected to a drain of the clamp N-type MOS transistor 12. To a gate of the P-type MOS transistor 9a, a selection signal N01 is supplied. The selection signal N01 indicates whether or not to select the reading current detection load current supply unit 9. On the other hand, to a gate of the P-type MOS transistor 9b, a load current control voltage LB(N), where N is a natural number, is supplied. A voltage value of the load current control voltage LB(N) can adjust an current output amount of the reading current detection load current supply unit 9.

The data "0" verification load current supply unit 10 is a current source that supplies a current having a variable output amount. In the data "0" verification load current supply unit 10, a P-type MOS transistor 10a and a P-type MOS transistor 10b are connected in series with each other. The data "0" verification load current supply unit 10 is connected to a drain of the clamp N-type MOS transistor 12. To a gate of the P-type MOS transistor 10a, a selection signal N0 is supplied. The selection signal N0 indicates whether or not to select the data "0" verification load current supply unit 10. On the other hand, to a gate of the P-type MOS transistor 10b, a load current control voltage LB(N) is supplied. A voltage value of the load current control voltage LB(N) can adjust an current output amount of the data "0" verification load current supply unit 10.

The data "1" verification load current supply unit 11 is a current source that supplies a current having a variable output amount. In the data "1" verification load current supply unit 11, a P-type MOS transistor 11a and a P-type MOS transistor 11b are connected in series with each other. The data "1" verification load current supply unit 11 is connected to a drain of the damp N-type MOS transistor 12. To a gate of the P-type MOS transistor 11a, a selection signal N1 is supplied. The selection signal N1 indicates whether or not to select the data "1" verification load current supply unit 11. On the other hand, to a gate of the P-type MOS transistor 11b, a load current control voltage LB(N) is supplied. A voltage value of the load current control voltage LB(N) can adjust an current output amount of the data "1" verification load current supply unit 11.

An output of the clamp voltage control circuit 13 is connected to a gate of the clamp N-type MOS transistor 12. The clamp voltage control circuit 13 has a function of setting a voltage at a bit line selected by the column selection circuit 6 to be lower than a predetermined voltage when reading data.

The differential amplifier 14 has two input terminals. The first input of the differential amplifier 14 is a contact point SEN between the four load current supply units and the clamp N-type MOS transistor 12. The second input of the differential amplifier 14 is the reference voltage REF that is set to a predetermined voltage. The output of the differential amplifier 14 is SO. The output SO of the differential amplifier 14 is an output of the sense amplification circuit 7.

A pulse voltage source Vw(M) supplies a predetermined pulse voltage instructed by the control circuit 18 to the writing circuit 15. For the pulse voltage source Vw(M), it is possible that a power source circuit is provided in the nonvolatile memory device 100 and a voltage generated by the power source circuit is used to generate a pulse voltage of the pulse voltage source Vw(M), or that a voltage supplied directly from the outside of the nonvolatile memory device 100 is used to generate a pulse voltage of the pulse voltage source Vw(M).

The writing circuit 15 is connected to either or both the column selection circuit 6 and the row selection circuit 5 (FIG. 1A does not show the case of connection to the row selection circuit 5), so as to supply, to either or both the column selection circuit 6 and the row selection circuit 5, a writing pulse when data is written to a memory cell 2, and a forming pulse when forming is performed on a memory cell 2. The writing circuit 15 adjusts a pulse voltage Vw(M) provided from the pulse voltage source Vw(M) to generate a writing pulse (a writing voltage or a writing current), and supplies the resulting writing pulse to either or both the column selection circuit 6 and the row selection circuit 5.

Regarding the writing circuit 15, a voltage supplied from the pulse voltage source Vw(M) is applied to a source of the writing circuit 15, and a drain of the writing circuit 15 includes a transistor and the like connected to the memory cell array 1. The writing circuit 15 supplies, to the memory cell array 1, a writing voltage that varies depending on a voltage applied from the pulse voltage source Vw(M).

The variable voltage source 16 outputs a predetermined load current control voltage LA(M) instructed by the control circuit 18.

The variable voltage source 17 outputs a predetermined load current control voltage LB(N) instructed by the control circuit 18.

The control circuit 18 controls the pulse voltage source Vw(M) (writing circuit 15) and the variable voltage sources 16 and 17 to instruct selection of an output voltage.

The storage unit 30 stores a table indicating the number of sneak current paths (hereinafter, a sneak current path number) in the case where each of the memory cells 2 is selected as a target of forming in the memory cell array 1. The control circuit 18 changes a forming pulse and a load current for a target memory cell 2 so as to supply at least one of an optimum forming pulse and an optimum load current based on the table in the storage unit 30. More specifically, the control circuit 18 supplies the target memory cell 2 with a forming pulse or a load current that is in proportion to the sneak current path number corresponding to the target memory cell 2 according to the table.

Here, the sneak current path number indicated in the table in the storage unit 30 depends on an order of selecting a target memory cell 2 in forming for the memory cell array 1, in other words, a forming order. Therefore, the storage unit 30 may hold a plurality of tables in association with various forming orders.

Figure 1B:
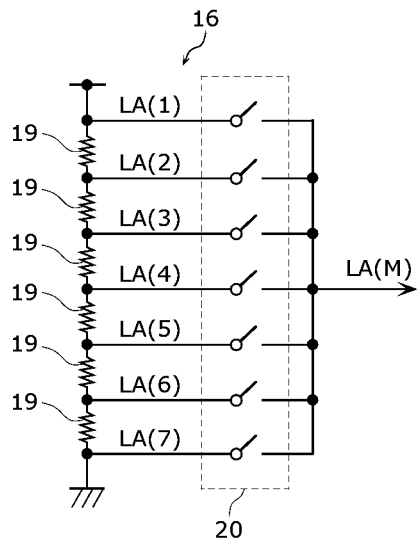
FIG. 1B is a circuit diagram showing a structure of a variable voltage source of the crosspoint nonvolatile memory device according to the embodiment of the present invention.
Figure 1C:
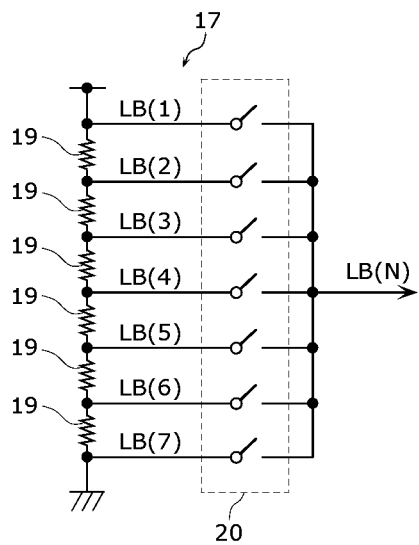
FIG. 1C is a circuit diagram showing a structure of a variable voltage source of the crosspoint nonvolatile memory device according to the embodiment of the present invention.

FIG. 1B is a circuit diagram showing an example of the structure of the variable voltage source 16. FIG. 1C is a circuit diagram showing an example of the structure of the variable voltage source 17.

As shown in FIG. 1B, the variable voltage source 16 has a structure in which six fixed resistance elements 19 are connected in series between a power source unit and a grand unit. The variable voltage source 16 causes a load current control voltage selection switch 20 to select one of contact points LA(1), LA(2), LA(3), LA(4), LA(5), LA(6), and LA(7), and outputs the selected contact point as the load current control voltage LA(M).

As shown in FIG. 1C, the variable voltage source 17 has a structure in which six fixed resistance elements 19 are connected in series between the power source unit and the grand unit. The variable voltage source 17 causes the load current control voltage selection switch 20 to select one of contact points LB(1), LB(2), LB(3), LB(4), LB(5), LB(6), and LB(7), and outputs the selected contact point as the load current control voltage LB(N).

It should be noted that it has been described that each of the variable voltage sources 16 and 17 includes the fixed resistance elements 19 connected in series with one another to supply equally divided voltages, but it is also possible that each of the variable voltage sources 16 and 17 weights the divided voltages to be supplied. Furthermore, the fixed resistance elements 19 may be replaced by transistors. In addition, each of the variable voltage sources 16 and 17 may have a structure of other generally-known variable voltage supply means.

Figure 2A:
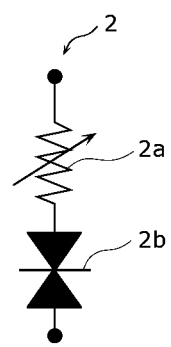
FIG. 2A is a circuit diagram showing a structure of a memory cell according to the embodiment of the present invention.

FIG. 2A is a circuit diagram showing a structure of each of the memory cells 2.

In each of the memory cells 2, a variable resistance element 2a is connected in series with a diode element 2b.

Figure 2B:
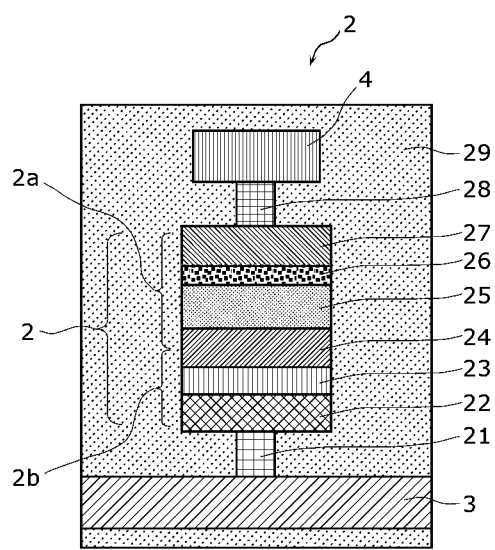
FIG. 2B is a cross-sectional view of the memory cell according to the embodiment of the present invention.

FIG. 2B is a cross-sectional view of an example of the memory cell 2.

The memory cell 2 has a multi-layered structure that includes the variable resistance element 2a and the diode element 2b.

The diode element 2b has a MSM structure in which a semiconductor layer 23 is provided between a first electrode 22 and a second electrode 24. The second electrode 24 of the diode element 2b serves also as a lower electrode of the variable resistance element 2a. On the second electrode 24 as the lower electrode, the variable resistance element 2a has a first variable resistance layer 25, a second variable resistance layer 26, and a third electrode 27 as an upper electrode. The variable resistance element 2a and the diode element 2b are covered with an insulation layer 29.

The first electrode 22 is connected to a word line 3 via a first via 21, while the third electrode 27 is connected to the bit line 4 via a second via 28.

The semiconductor layer 23 comprises nitrogen-deficient silicon nitride ($SiN_x$). Here, the nitrogen-deficient silicon nitride refers to silicon nitride having a nitride content atomic percentage that is lower than that of $Si_3N_4$ which is silicon nitride of stoichiometric composition. The nitrogen-deficient silicon nitride has properties as a semiconductor.

Each of the first electrode 22 and the second electrode 24 may comprise TaN (tantalum nitride), TiN (titanium nitride), or W (tungsten). Here, each of the first electrode 22 and the second electrode 24 comprises TaN having a thickness of 50 nm.

The third electrode 27 may comprise Pt (platinum), Ir (iridium), Pd (palladium) or an alloy of these materials. Here, the third electrode 27 comprises Ir having a thickness of 50 nm.

The variable resistance element 2a includes: the second electrode 24; the third electrode 27; the first variable resistance layer 25 provided between the second electrode 24 and the third electrode 27; and the second variable resistance layer 26. The first variable resistance layer 25 and the second variable resistance layer 26 are collectively called a variable resistance layer.

The variable resistance layer is a layer having a resistance value that is reversibly changed based on an electrical signal applied between the second electrode 24 and the third electrode 27. For example, the variable resistance layer is a layer that is reversibly changed between a high resistance state and a low resistance state according to a polarity of a voltage applied between the second electrode 24 and the third electrode 27. The variable resistance layer includes at least two layers: the first variable resistance layer 25 connected to the second electrode 24, and the second variable resistance layer 26 connected to the third electrode 27.

The first variable resistance layer 25 comprises a first oxygen-deficient metal oxide, and the second variable resistance layer 26 comprises a second metal oxide having a less oxygen deficient degree than the oxygen deficient degree of the first metal oxide. In the second variable resistance layer 26 in the variable resistance element 2a, there is a minute local region in which an oxygen deficient degree is reversibly changed according to an applied electrical pulse. The local region is considered as including filament comprising oxygen defect sites.

The "oxygen deficient degree" of a metal oxide refers to a ratio of (a) an amount of deficient oxygen to (b) an amount of oxygen included in an oxide of a stoichiometric composition (a stoichiometric composition having the highest resistance value, if there are a plurality of stoichiometric compositions) in the oxide metal. A metal oxide having a stoichiometric composition is more stable and has a higher resistance value in comparison to metal oxides having other compositions.

For example, in the case where a metal is tantalum (Ta), as an oxide of a stoichiometric composition is $Ta_2O_5$ in the above definition, the tantalum oxide can be expressed as $TaO_{2.5}$. An oxygen deficient degree of $TaO_{2.5}$ is 0%, and an oxygen deficient degree of $TaO_{1.5}$ is $(2.5-1.5)/2.5=40\%$. Furthermore, an oxygen-excess metal oxide has an oxygen deficient degree having a negative value. In the description, oxygen deficient degrees are described as including positive values, zero, and negative values, unless otherwise noted.

An oxide having a low oxygen deficient degree has a high resistance value because it is more similar to an oxide of a stoichiometric composition. On the other hand, an oxide having a high oxygen deficient degree has a low resistance value because it is more similar to a metal included in an oxide.

The "oxygen content atomic percentage" is a ratio of a total number of oxygen atoms to a total number of atoms. For example, an oxygen content atomic percentage of $Ta_2O_5$, which is a ratio of a total number of oxygen to a total number of atoms (O/Ta+O), is 71.4 atm %, Therefore, an oxygen-deficient tantalum oxide has an oxygen content atomic percentage that is greater than 0 and smaller than 71.4 atm %. For example, if a metal included in the first metal oxide layer is the same as a metal included in the second metal oxide layer, the oxygen content atomic percentage corresponds to the oxygen deficient degree. In other words, if the oxygen content atomic percentage of the second metal oxide is greater than the oxygen content atomic percentage of the first metal oxide, the oxygen deficient degree of the second metal oxide is lower than the oxygen deficient degree of the first metal oxide.

In the case where a metal in the variable resistance layer is tantalum, when x is in a range from 0.8 to 1.9 inclusive where a composition of the first metal oxide is $TaO_x$ and y is 2.1 or more where a composition of the second metal oxide is $TaO_y$, it is possible to provide a variable resistance layer having a resistance value that is stably and speedily changed. In this case, a thickness of the second metal oxide may be in a range from 1 nm to 8 nm inclusive.

The metal included in the variable resistance layer may be a metal that is not tantalum. The metal included in the variable resistance layer may be a transition metal or aluminium (Al). The transition metal may be tantalum (Ta), titanium (Ti), hafnium (Hf), zirconium (Zr), niobium (Nb), tungsten (W), nickel (Ni), or the like. As the transition metal may be in various oxidation states, it is possible to achieve a different resistance state by oxidation-reduction reaction.

For example, in the case where a hafnium oxide is used, when the first metal oxide has a composition $HfO_x$ where x ranges from 0.9 to 1.6 inclusive, and the second metal oxide has a composition $HfO_y$ where y is greater than x, it is possible to stably and speedily change a resistance value of the variable resistance layer. In this case, a thickness of the second metal oxide may be in a range from 3 nm to 4 nm inclusive.

For example, in the case where a zirconium oxide is used, when the first metal oxide has a composition $ZrO_x$ where x ranges from 0.9 to 1.4 inclusive, and the second metal oxide has a composition $ZrO_y$ where y is greater than x, it is possible to stably and speedily change a resistance value of the variable resistance layer. In this case, a thickness of the second metal oxide be in a range from 1 nm to 5 nm inclusive.

It should be noted that a first metal included in the first metal oxide serving as the first variable resistance layer 25 may be different from a second metal included in the second metal oxide serving as the second variable resistance layer 26. In this case, the second metal oxide may have an lower oxygen deficient degree than that of the first metal oxide, in other words, the second metal oxide has resistance higher than that of the first metal oxide. With the above structure, a voltage applied between the second electrode 24 and the third electrode 27 in changing resistance is distributed more to the second metal oxide. As a result, oxidation-reduction reaction is likely to occur in the second metal oxide second metal oxide.

Furthermore, if the first metal included in the first metal oxide serving as the first metal oxide is different from the second metal included in the second metal oxide, a standard electrode potential of the second metal may be lower than that of the first metal. A standard electrode potential having a higher value has characteristics of being more unlikely to be oxidized. Thereby, oxidation-reduction reaction is likely to occur in the second metal oxide that has a relatively low standard electrode potential. It is considered that, in the resistance change phenomenon, oxidation-reduction reaction occurs in a minute local region formed in the second metal oxide having high resistance and thereby a filament (conductive path) is changed, so that the resistance value (oxygen deficient degree) is changed.

For example, the first metal oxide comprises an oxygen-deficient tantalum oxide ($TaO_x$), and the second metal oxide comprises a titanium oxide ($TiO_2$), so that stable resistance change is possible. Titanium (standard electrode potential=−1.63 eV) is a material having a lower standard electrode potential than that of tantalum (standard electrode potential=−0.6 eV). As described above, when the second metal oxide comprises a metal oxide having a standard electrode potential that is lower than a standard electrode potential of the first metal oxide, oxidation-reduction reaction is likely to occur in the second metal oxide. It is also possible that the second metal oxide serving as a high resistance layer comprises a aluminium oxide ($Al_2O_3$) for another combination. For example, it is possible that the first metal oxide comprises an oxygen-deficient tantalum oxide ($TaO_x$) and the second metal oxide comprises an aluminium oxide ($Al_2O_3$).

It is considered that, in the resistance change phenomenon in the variable resistance layer in the multi-layer structure, oxidation-reduction reaction occurs in a minute local region formed in the second metal oxide having high resistance and thereby a filament (conductive path) in the local region is changed, so that the resistance value is changed.

More specifically, when a positive voltage with respect to the second electrode 24 is applied to the third electrode 27 connected to the second metal oxide, oxygen ions in the variable resistance layer are pulled towards the second metal oxide. Therefore, oxidation reaction occurs in the minute local region formed in the second metal oxide, and thereby the oxygen deficient degree is decreased. As a result, it is considered that oxygen defect sites are unlikely to connect to one another to form a filament in the local region, thereby increasing the resistance value.

In contrast, when a negative voltage with respect to the second electrode 24 is applied to the third electrode 27 connected to the second metal oxide, oxygen ions in the second metal oxide are moved towards the first metal oxide. Therefore, oxidation reaction occurs in the minute local region formed in the second metal oxide, and thereby the oxygen deficient degree is increased. As a result, it is considered that oxygen defect sites are likely to connect to one another to form a filament in the local region, thereby decreasing the resistance value.

The third electrode 27 connected to the second metal oxide having the low oxygen deficient degree comprises a material having a higher standard electrode potential than that of the metals included in the second metal oxide, such as platinum (Pt), iridium (Ir), and palladium (Pd), and the material of the second electrode 24. Furthermore, the second electrode 24 connected to the first metal oxide having a higher oxygen deficient degree may comprise a material having a lower standard electrode potential than that of the metal included in the first metal oxide, such as tungsten (W), nickel (Ni), tantalum (Ta), titanium (Ti), aluminium (Al), tantalum nitride (TaN), or titanium nitride (TiN). A standard electrode potential having a higher value has characteristics of being more unlikely to be oxidized.

More specifically, it is possible that $Vr2<V2$ and $V1<V2$, where V2 represents a standard electrode potential of the third electrode 27, Vr2 represents a standard electrode potential of a metal included in the second metal oxide, Vr1 represents a standard electrode potential of a metal included in the first metal oxide, and V1 represents a standard electrode potential of the second electrode 24. Furthermore, it is possible that $V2>Vr2$ and $Vr1 \geq V1$.

With the above structure, in the second metal oxide near the interface between the second electrode and the second metal oxide, oxidation-reduction reaction selectively occurs to cause stable resistance change phenomenon.

It should be noted that the structure of the memory cell 2 is not limited to the structure shown in FIG. 2B, but may be any other structure as long as the equivalent circuit in FIG. 2A can be obtained.

Figure 2C:
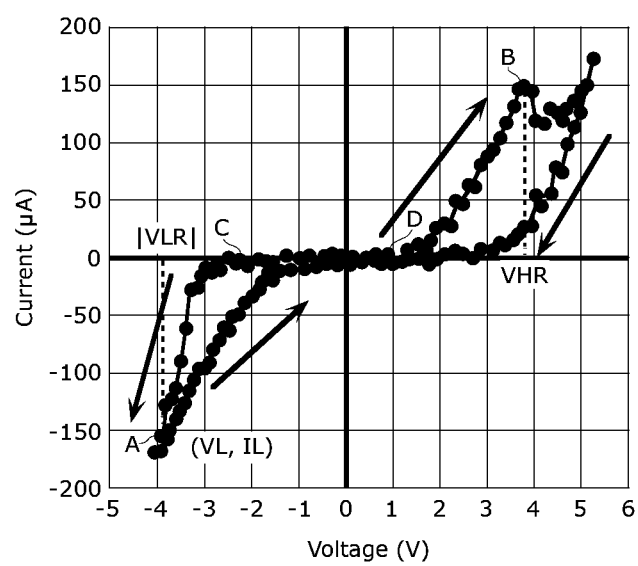
FIG. 2C is a graph plotting IV characteristics regarding resistance changes of the memory cell according to the embodiment of the present invention.

FIG. 2C shows a VI curve of resistance changes of the memory cell 2.

In FIG. 2C, a voltage direction where a word line 3 has a higher voltage than that of a bit line 4 is a negative voltage side, while a voltage direction where a bit line 4 has a higher voltage than that of a word line 3 is a positive voltage side. Then, in a negative voltage region between point C and point A, the memory cell 2 changes from a high resistance state to a low resistance state. On the other hand, in a positive voltage region from D to point B or more, the memory cell 2 bi-directionally changes between the low resistance state and the high resistance state. In other words, application of a negative voltage for low resistance writing (LR writing) changes the resistance state of the memory cell 2 from the high resistance state to the low resistance state, while application of a positive voltage for high resistance writing (HR writing) changes the resistance state of the memory cell 2 from the low resistance state to the high resistance state. It should be noted that an off region where a current hardly flows, which is seen between point C and point D, results from non-linear characteristics of the diode element 2b.

[Forming Characteristics of Variable Resistance Element]

Meanwhile, the reversible resistance change shown in FIG. 2C can be started when an operation called forming is performed on the memory cell 2 after manufacturing. For example, an example of the forming operation disclosed in Patent Literature 2 is described below.

Figure 3A:
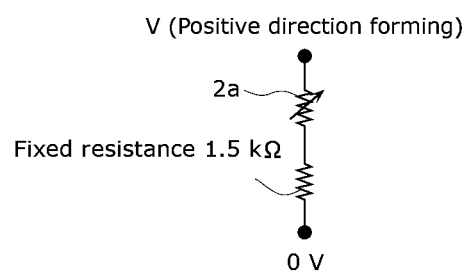
FIG. 3A is a circuit diagram showing a structure of an evaluation element according to the embodiment of the present invention.

FIG. 3A is a circuit diagram showing a structure of an evaluation element used in measurement.

In the evaluation element shown in FIG. 3A, the variable resistance element 2a having the same structure as shown in FIG. 2B is connected in series with a fixed resistance element of 1.5 kΩ.

Figure 3B:
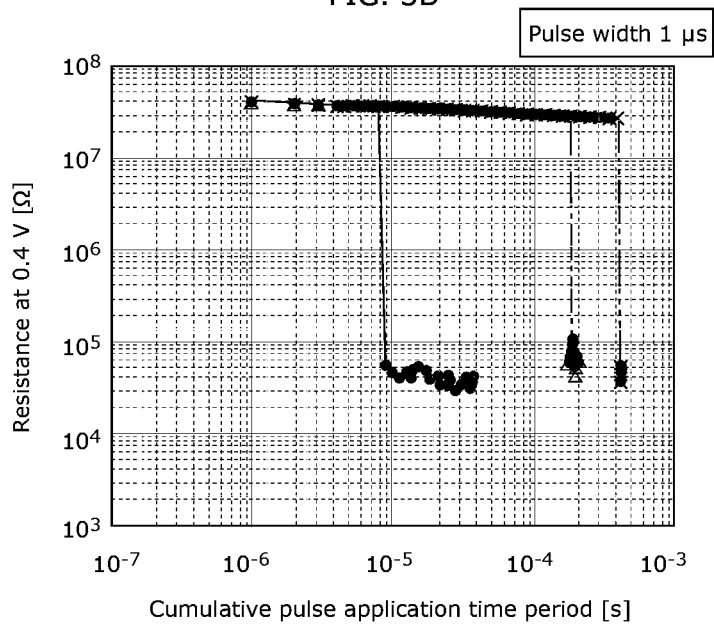
FIG. 3B is a graph plotting, for each of three evaluation elements, transition of a resistance value when a forming pulse is applied to the target evaluation element according to the embodiment of the present invention.

FIG. 3B is a graph plotting transition of resistance values of three evaluation elements each as shown in FIG. 3A when a forming pulse is applied to the three evaluation elements. In FIG. 3B, for example, a relationship between a resistance value of the variable resistance element 2a and a cumulative pulse application time of the forming pulse when forming is tried by applying a forming positive voltage pulse (pulse width=1 μs) is plotted.

As shown in FIG. 3B, the cumulative pulse application time varies depending on the evaluation elements, but the resistance state of each of the evaluation elements is suddenly lowered from a super high resistance state (the first resistance state) of tens of MΩ to a high resistance state (the second resistance state) of tens of kΩ. The lowered resistance state corresponds to the state where forming has been completed. The evaluation results show that the pulse application counts required for forming completion depend on the variable resistance elements. However, if forming is terminated when the state where a resistance value is significantly lowered from an initial state is detected, it is possible to avoid waste and to perform good forming.

[Basic Explanation Relating to Forming of Crosspoint Nonvolatile Memory Device]

Prior to detailed description of the present invention, new insights as basics of the present invention are described below.

The insights relate to a sneak current in a crosspoint nonvolatile memory device. The insights are described below with reference to FIGS. 4A to 8. However, they are given to help understanding of the structure of the present invention as described later. The present invention is not limed to these figures and the description.

Figure 4A:
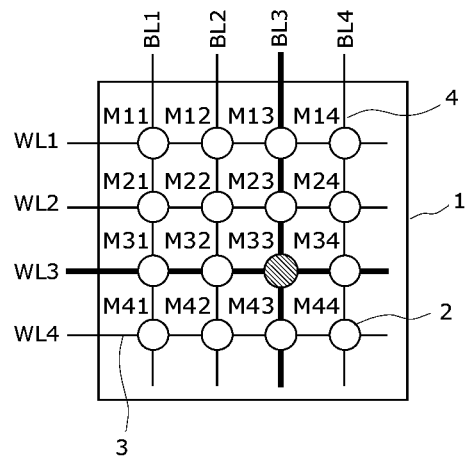
FIG. 4A is a diagram showing a detailed structure of a 4×4 memory cell array according to the embodiment of the present invention.

FIG. 4A is a diagram showing the structure of the memory cell array 1 shown in FIG. 1A in more detail.

In FIG. 4A, the word lines 3 are shown as WL1 to WL4 for the sake of simplicity in explanation of a selected line. Likewise, the bit lines 4 are simply shown as BL1 to BL4. Furthermore, thick lines show selected lines. More specifically, WL3 shown as a thick line is a selected word line, and BL3 shown as a thick line is a selected bit line. When WL3 and BL3 are selected, a predetermined voltage difference is applied between WL3 and BL3 to cause a current to flow in a memory cell 2 at a position where WL3 and BL3 crosses each other and to cause the other word lines 3 and the other bit lines 4 to be in a floating state. Moreover, regarding the memory cells 2, a white circle shows a memory cell on which forming has not been performed, a black circle shows a memory cell on which forming has already been performed, and a dashed circle shows a memory cell selected for performing (M33 in FIG. 4). The above are the same in the following explanation.

Figure 4B:
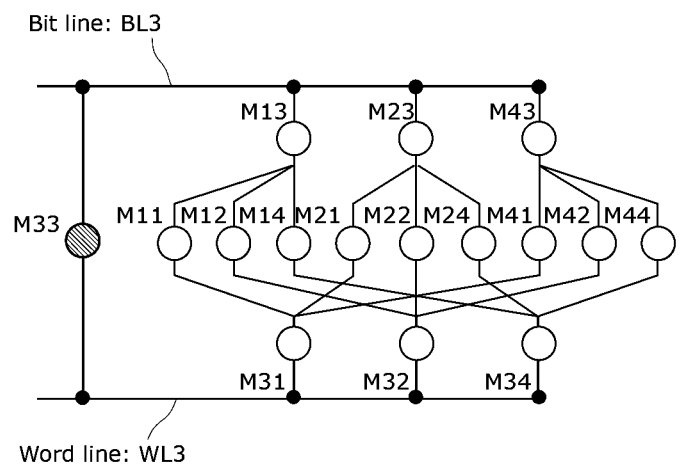
FIG. 4B is an equivalent circuit schematic of the 4×4 memory cell array according to the embodiment of the present invention.

FIG. 4B shows that the memory cell array 1 in FIG. 4A is developed to an equivalent circuit schematic.

In FIG. 46, between the bit line 4 (BL3) and the word line 3 (WL3), there is the selected memory cell 2 (M33). Furthermore, in parallel to the selected memory cell 2 (M33), there is the memory cell 2 (M13). For example, the memory cell 2 (M13) has one end connected to the bit line 4 (BL3) and the other end connected to the word line 3 (WL1). The memory cell 2 (M13) is connected to the bit line 4 (BL1) via the memory cell 2 (M11) and to the word line 3 (WL3) via the memory cell 2 (M31). Therefore, a current path (sneak current path), such as "memory cell 2 (M13)-memory cell 2 (M11)-memory cell 2 (M31)", is formed by the bit line 4 (BL3) and the word line 3 (WL3) which connect non-selected memory cells 2 at three stages in series with one another (hereinafter, the connection is referred to as a "three-stage serial connection relationship"). Likewise, there are formed other sneak current paths of "memory cell 2 (M13)-memory cell 2 (M12)-memory cell 2 (M32)", "memory cell 2 (M13)-memory cell 2 (M14)-memory cell 2 (M34)", "memory cell 2 (M23)-memory cell 2 (M21)-memory cell 2 (M31)", "memory cell 2 (M23)-memory cell 2 (M22)-memory cell 2 (M32)", "memory cell 2 (M23)-memory cell 2 (M24)-memory cell 2 (M34)", "memory cell 2 (M43)-memory cell 2 (M41)-memory cell 2 (M31)", "memory cell 2 (M43)-memory cell 2 (M42)-memory cell 2 (M32)", and "memory cell 2 (M43)-memory cell 2 (M44)-memory cell 2 (M34)".

Figure 4C:
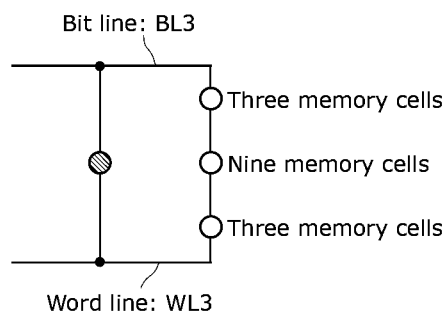
FIG. 4C is a degenerated equivalent circuit schematic of the equivalent circuit schematic of the 4×4 memory cell array according to the embodiment of the present invention.

FIG. 4C is a degenerated equivalent circuit schematic of the equivalent circuit shown in FIG. 4B when memory cells 2 other than the selected memory cell 2 (M33) are in the same resistance state.

The resistance states of the memory cells 2 other than the selected memory cell 2 (M33) are the same. Therefore, as shown in FIG. 4C, it is possible to simplify a sneak current path connecting non-selected memory cells 2 having a three-stage serial connection relationship, into a connection relationship in which three memory cells 2 are connected in parallel at an upper stage, nine memory cells 2 (a product of the number of the memory cells 2 at the upper stage by the number of the memory cells 2 at a lower stage) are connected in parallel at a middle stage, and three memory cells 2 are connected in parallel at the lower stage.

Next, with reference to the equivalent circuit schematic of the memory cell array 1, the description is given for an amount of a sneak current in forming in several cases (cases where the memory cells 2 other than the selected memory cell 2 have different resistance states).

Figure 5A:
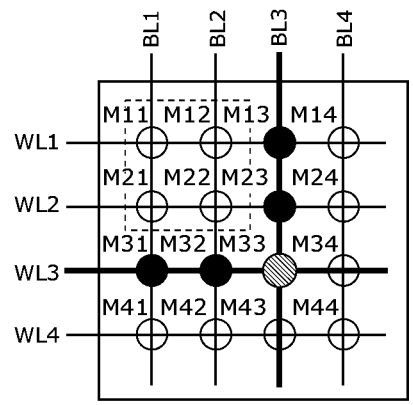
FIG. 5A is an equivalent circuit schematic for explaining a forming process of the 4×4 memory cell array according to the embodiment of the present invention.

Like FIG. 4A, FIG. 5A shows a case where the memory cell 2 (M33) is selected for forming. However, it is assumed in FIG. 5A that (a) the memory cell 2 (M13) and the memory cell 2 (M23) which are connected to the selected bit line 4 (BL3) and (b) the memory cell 2 (M31) and the memory cell 2 (M32) which are connected to the selected word line 3 (WL3) have already been applied with forming (hereinafter, expressed also as "formed") as shown by black circles. On the other hand, it is assumed that forming has not yet been performed on the memory cells 2 shown by white circles except the memory cells 2 shown by the black circles.

Figure 5B:
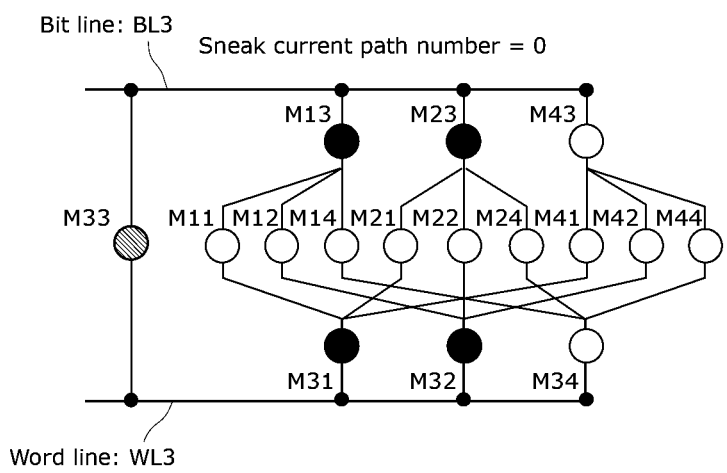
FIG. 5B is an equivalent circuit schematic for explaining a forming process of the 4×4 memory cell array according to the embodiment of the present invention.

FIG. 5B shows an equivalent circuit schematic of FIG. 5A. It should be noted that the connection relationship in FIG. 5B is the same as that in FIG. 4B, so that it is not described again below.

As seen in the equivalent circuit schematic in FIG. 5B, in each of the sneak current paths via the non-selected memory cells 2 having the three-stage serial connection relationship, the middle stage has only memory cells 2 on which forming has not yet been performed. The memory cells 2 on which forming has not yet been performed are in the super high resistance state. Therefore, a sneak current is blocked by the middle stage so that a sneak current does not flow in the state of FIG. 5A. This state is defined as the state where the sneak current path number is 0.

Figure 5C:
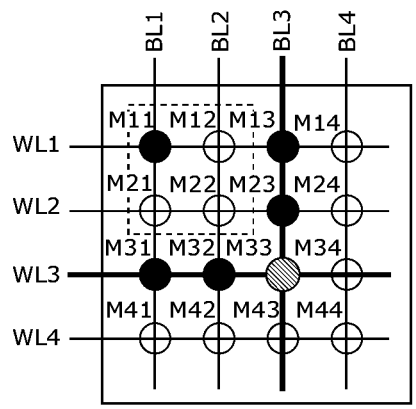
FIG. 5C is an equivalent circuit schematic for explaining a forming process of the 4×4 memory cell array according to the embodiment of the present invention.

Like FIG. 4A, FIG. 5C shows a case where the memory cell 2 (M33) is selected for forming. However, FIG. 5C differs from FIG. 5A in that the memory cell 2 (M11) is assumed to have already been formed.

Figure 5D:
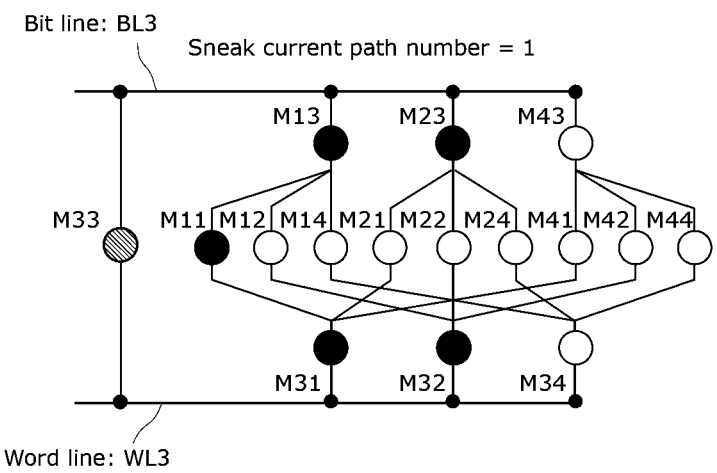
FIG. 5D is an equivalent circuit schematic for explaining a forming process of the 4×4 memory cell array according to the embodiment of the present invention.

FIG. 5D shows an equivalent circuit schematic of FIG. 5C.

As seen in the equivalent circuit schematic in FIG. 5D, among the sneak current path connecting the non-selected memory cells 2 having the three-stage serial connection relationship, one sneak current path "memory cell 2 (M13)-memory cell 2 (M11)-memory cell 2 (M31)" includes only forming-performed memory cells 2. On the other hand, in each of the other sneak current paths, at upper, middle, and/or lower stages, there is at least one memory cell 2 which is in the super high resistance state and on which forming has not yet been performed. As a result, a sneak current is blocked in the other sneak current paths. This state is defined as the state where the sneak current path number is 1.

Figure 5E:
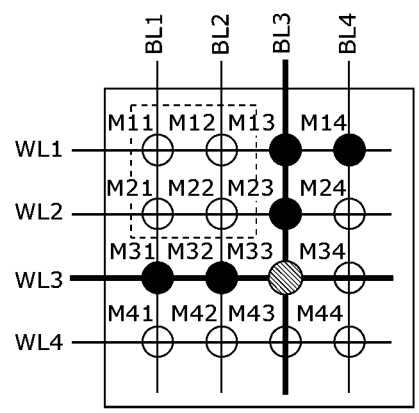
FIG. 5E is an equivalent circuit schematic for explaining a forming process of the 4×4 memory cell array according to the embodiment of the present invention.

Like FIG. 4A, FIG. 5E shows a case where the memory cell 2 (M33) is selected for forming. However, FIG. 5E differs from FIG. 5C in that the memory cell 2 (M14) not the memory cell 2 (M11) is assumed to have already been formed.

Figure 5F:
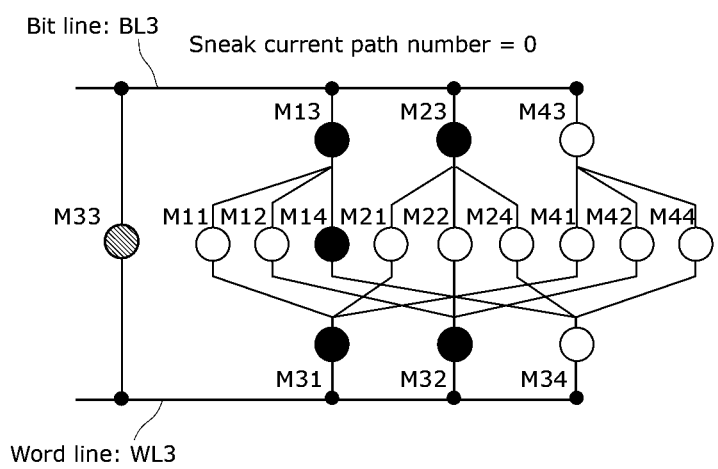
FIG. 5F is an equivalent circuit schematic for explaining a forming process of the 4×4 memory cell array according to the embodiment of the present invention.

FIG. 5F shows an equivalent circuit schematic of FIG. 5E.

As seen in the equivalent circuit schematic in FIG. 5F, in each of the sneak current paths via the non-selected memory cells 2 having the three-stage serial connection relationship, at upper, middle, and/or lower stages, there is at least one memory cell 2 on which forming has not yet been performed and which is therefore in the super high resistance state. As a result, a sneak current is blocked in the sneak current paths. Therefore, the sneak current path number is 0. In other words, although the number of forming-performed memory cells 2 is the same between the case of FIG. 5F and the case of FIG. 5C, the sneak current path number is different according to an arrangement of forming-performed memory cells 2.

Figure 5G:
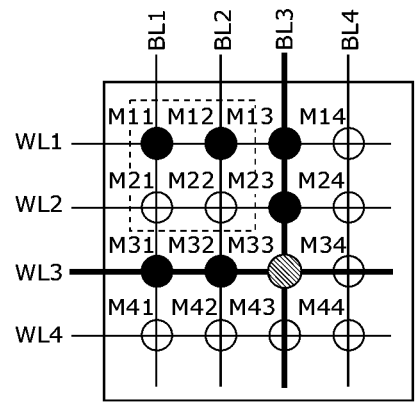
FIG. 5G is an equivalent circuit schematic for explaining a forming process of the 4×4 memory cell array according to the embodiment of the present invention.

Like FIG. 4A, FIG. 5G shows a case where the memory cell 2 (M33) is selected for forming. However, FIG. 5G differs from FIG. 5C in that the memory cell 2 (M12) in addition to the memory cell 2 (M11) are assumed to have been formed.

Figure 5H:
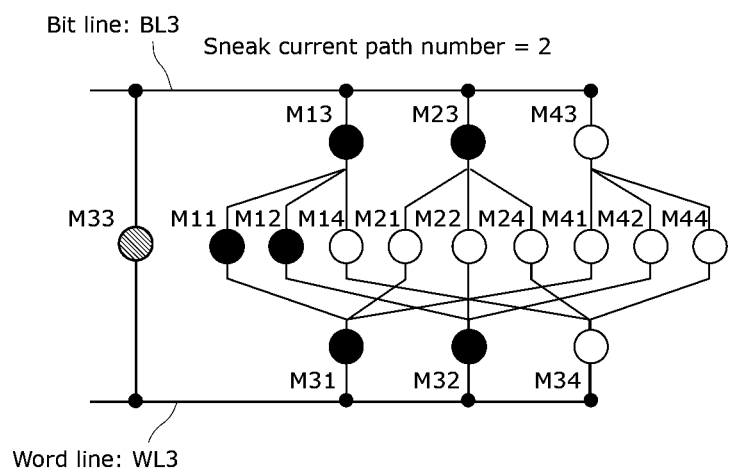
FIG. 5H is an equivalent circuit schematic for explaining a forming process of the 4×4 memory cell array according to the embodiment of the present invention.

FIG. 5H shows an equivalent circuit schematic of FIG. 5G.

As seen in the equivalent circuit schematic in FIG. 5H, among the sneak current paths via the non-selected memory cells 2 having the three-stage serial connection relationship, each of two sneak current paths "memory cell 2 (M13)-memory cell 2 (M11)-memory cell 2 (M31)" and "memory cell 2 (M13)-memory cell 2 (M12)-memory cell 2 (M32)" includes only forming-performed memory cells 2. On the other hand, in each of the other sneak current paths, at upper, middle, and/or lower stages, there is at least one memory cell 2 on which forming has not yet been performed and which is therefore in the super high resistance state. As a result, a sneak current is blocked in the other sneak current paths. This state is defined as the state where the sneak current path number is 2.

Figure 5I:
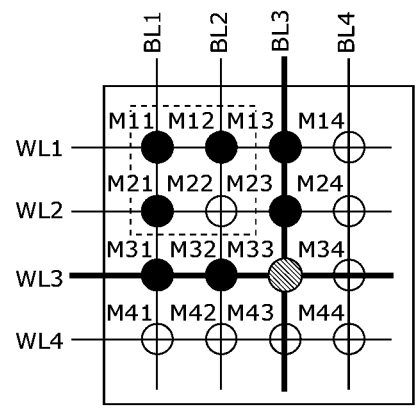
FIG. 5I is an equivalent circuit schematic for explaining a forming process of the 4×4 memory cell array according to the embodiment of the present invention.

Like FIG. 4A, FIG. 5I shows a case where the memory cell 2 (M33) is selected for forming. However, FIG. 5I differs from FIG. 5G in that the memory cell 2 (M21) in addition to the memory cell 2 (M11) and the memory cell 2 (M12) are assumed to have been formed.

Figure 5J:
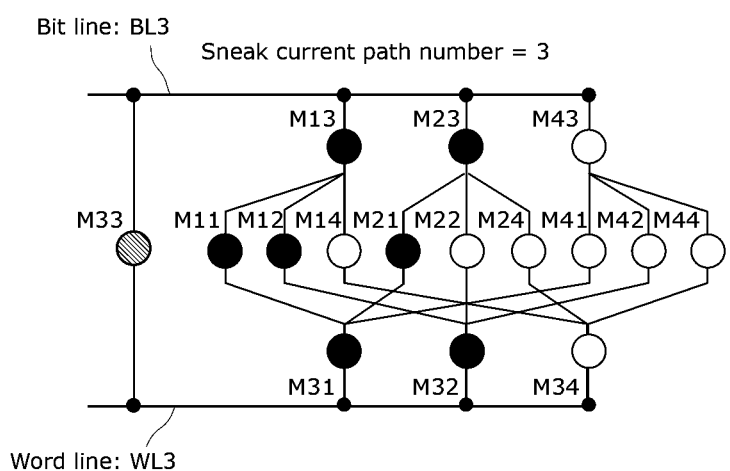
FIG. 5J is an equivalent circuit schematic for explaining a forming process of the 4×4 memory cell array according to the embodiment of the present invention.

FIG. 5J shows an equivalent circuit schematic of FIG. 5I.

As seen in the equivalent circuit schematic in FIG. 5J, among the sneak current paths via the non-selected memory cells 2 having the three-stage serial connection relationship, each of three sneak current paths "memory cell 2 (M13)-memory cell 2 (M11)-memory cell 2 (M31)", "memory cell 2 (M13)-memory cell 2 (M12)-memory cell 2 (M32)", and "memory cell 2 (M23)-memory cell 2 (M21)-memory cell 2 (M31)" includes only forming-performed memory cells 2. On the other hand, in each of the other sneak current paths, at upper, middle, and/or lower stages, there is at least one memory cell 2 on which forming has not yet been performed and which is therefore in the super high resistance state. As a result, a sneak current is blocked in the other sneak current paths. This state is defined as the state where the sneak current path number is 3.

Figure 5K:
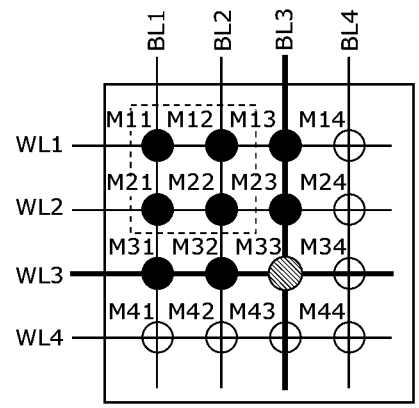
FIG. 5K is an equivalent circuit schematic for explaining a forming process of the 4×4 memory cell array according to the embodiment of the present invention.

Like FIG. 4A, FIG. 5K shows a case where the memory cell 2 (M33) is selected for forming. However, FIG. 5K differs from FIG. 5I in that the memory cell 2 (M22) in addition to the memory cell 2 (M11), the memory cell 2 (M12), and the memory cell 2 (M21) are assumed to have been formed.

Figure 5L:
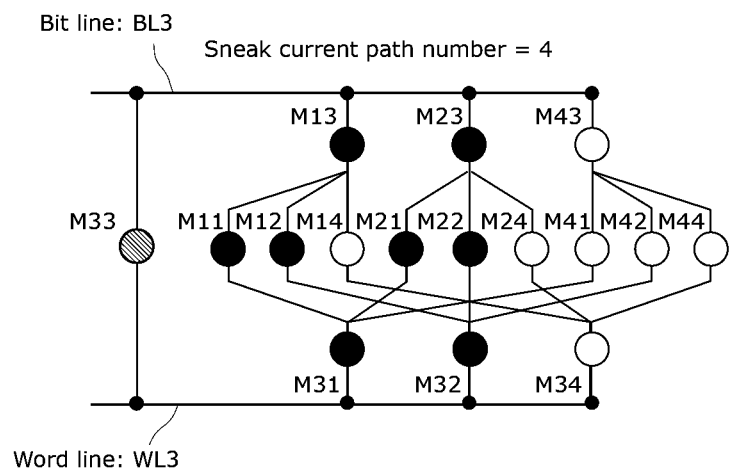
FIG. 5L is an equivalent circuit schematic for explaining a forming process of the 4×4 memory cell array according to the embodiment of the present invention.

FIG. 5L shows an equivalent circuit schematic of FIG. 5K.

As seen in the equivalent circuit schematic in FIG. 5L, among the sneak current paths via the non-selected memory cells 2 having the three-stage serial connection relationship, each of four sneak current paths "memory cell 2 (M13)-memory cell 2 (M11)-memory cell 2 (M31)", "memory cell 2 (M13)-memory cell 2 (M12)-memory cell 2 (M32)", "memory cell 2 (M23)-memory cell 2 (M21)-memory cell 2 (M31)", and "memory cell 2 (M23)-memory cell 2 (M22)-memory cell 2 (M32)" includes only forming-performed memory cells 2. On the other hand, in each of the other sneak current paths, at upper, middle, and/or lower stages, there is at least one memory cell 2 on which forming has not yet been performed and which is therefore in the super high resistance state. As a result, a sneak current is blocked in the other sneak current paths. This state is defined as the state where the sneak current path number is 4.

As described above, the sneak current path number corresponds to two forming-performed memory cells 2, from among memory cells 2 (memory cells 2 (M11, M12, M21, and M22) surrounded by a broken line in each of FIGS. 5A, 5C, 5E, 5G, 5I, and 5K) located at crosspoints between (a) non-selected word lines that are connected to the forming-performed memory cells 2 (M13 and M23) connected to the selected bit line and (b) non-selected bit lines that are connected to forming-performed memory cells 2 (M31 and M32) connected to the selected word line.

Next, the sneak current path number is generalized to be explained.

Figure 6:
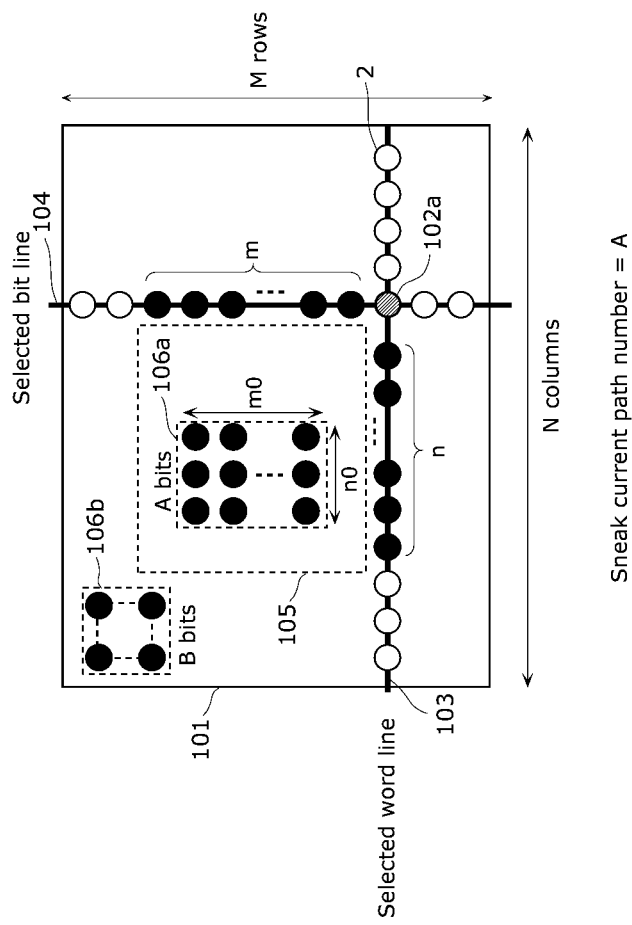
FIG. 6 is a diagram for explaining a sneak current path number in the memory cell array according to the embodiment of the present invention.

FIG. 6 shows that the memory cell array 1 having four rows and four columns is expanded to be generalized as a memory cell array 101 having M rows and N columns. The structural elements in the memory cell array 101 are the same as those in the memory cell array 1, so that they are not described again below.

It should be noted that FIG. 6 shows only a selected word line 103 and a selected bit line 104, and does not show non-selected word lines and non-selected bit lines. It should also be noted that FIG. 6 shows only forming-performed memory cells among memory cells connected to lines other than the selected word line 103 or the selected bit line 104, and does not show the other memory cells.

It should also be note that FIG. 6 shows the case where forming is performed on a selected memory cell 102a at a crosspoint between the selected word line 103 and the selected bit line 104. It is assumed that there are n-bit forming-performed memory cells on the selected word line 103, and there are m-bit forming-performed memory cells on the selected bit line 104. It is also assumed that a region where non-selected bit lines (not shown) and non-selected word lines (not shown) which are connected to the forming-performed memory cells cross each other is referred to as a crosspoint region 105, and that the crosspoint region 105 includes A-bit forming-performed memory cell region 106a.

In FIG. 6, the forming-performed memory cell region 106a in the crosspoint region 105 is expressed as a grouped unit of m0 rows and n0 columns. This expression is for the sake of facilitating the description below. It is therefore possible that the forming-performed memory cell region 106a in the crosspoint region 105 includes dispersed rows and columns of memory cells. It is further possible that there is a B-bit forming-performed memory cell region 106b in a region to which the crosspoint region 105 does not belong.

Figure 7:
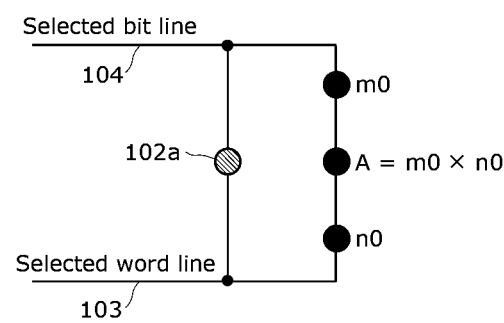
FIG. 7 is an equivalent circuit schematic of the diagram for explaining a sneak current path number in the memory cell array according to the embodiment of the present invention.

FIG. 7 shows a degenerated equivalent circuit schematic of the memory cell array 101 having M rows and N columns shown in FIG. 6.

In FIG. 7, in parallel to the selected memory cell 102a having one end connected to the selected bit line 104 and the other end connected to the selected word line 103, there is a sneak current path having a three-stage serial connection relationship with a middle stage that is the A-bit (=m0 bits×n0 bits) forming-performed memory cell region 106a as a sneak current path. In the sneak current paths having a three-stage serial connection relationship, among m-bit forming-performed memory cells connected to the selected bit line 104, the upper stage includes m0-bit forming-performed memory cells connected to the selected word line 103 via the memory cells in the crosspoint region 105. Furthermore, among n-bit forming-performed memory cells connected to the selected word line 103, the lower stage includes n0-bit forming-performed memory cells connected to the selected bit line 104 via the memory cells in the crosspoint region 105.

The sneak current path number in the generalized case as described above is also analogized from the explanation of FIGS. 5A to 5L, and corresponds to A that is the number of forming-performed memory cells belonging to the crosspoint region 105. On the other hand, the sneak current path via forming-performed memory cells other than memory cells in the crosspoint region 105 is not included in the sneak current path number corresponding to the state where a sneak current is blocked by any of the upper stage and the lower stage of the sneak current paths of non-selected memory cells having a three-stage serial connection relationship which is shown in the equivalent circuit schematic of the memory cell array 101.

Figure 8:
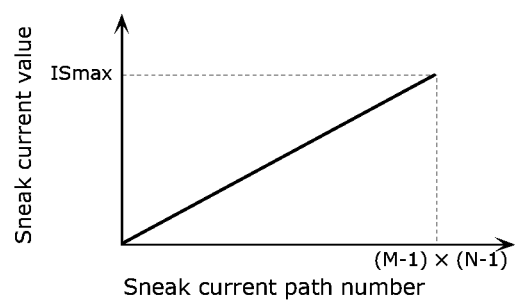
FIG. 8 is a diagram for explaining a relationship between the number of sneak current paths in the memory cell array and values of the sneak currents according to the embodiment of the present invention.

FIG. 8 shows a relationship between a sneak current path number and a value of a sneak current (hereinafter, referred to as a "sneak current value").

The sneak current path number corresponds to the number of sneak current paths arranged in parallel to each other. Therefore, there is a substantially linear relationship between the sneak current path number and a sneak current value. The number of sneak current paths reaches a maximum value, when all of memory cells except a last one-bit memory cell to be formed have already been formed. In other words, in the memory cell array having M rows and N columns, the number of sneak current paths becomes maximum when the forming-performed memory cell region 106a consists of (M−1)×(N−

1) memory cells. When the sneak current value in the above situation is expressed as ISmax, a sneak current value in the other situations is calculated based on proportional division using the sneak current path number according to "the sneak current value=ISmax×{sneak current path number/(M−1)× (N−1)}". The sneak current path number can be calculated based on information indicating which memory cells have been formed until which time.

It should be noted that this sneak current value depends on a voltage applied between the selected bit line 104 and the selected word line 103. Although the sneak current path number is the same, a sneak current value is different between the case of reading from the selected memory cell 102a and the case of performing forming. Therefore, it is obvious that calculation of a sneak current value is to be performed for each operation.

Figure 9A:
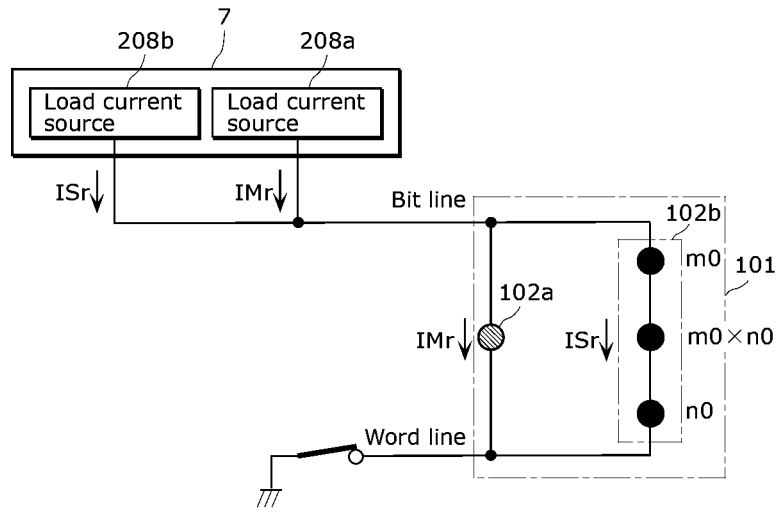
FIG. 9A is a diagram for explaining a read circuit according to the embodiment of the present invention.

FIG. 9A explains the concept in the case where the present invention is applied to forming operation (reading operation) for a determination of a forming state of a target memory cell in forming (hereinafter, the determination is referred to also as a "forming determination").

When data is to be read from the selected memory cell 102a, a load current source 208a corresponding to the reading current detection load current supply unit 9 in the sense amplification circuit 7 supplies the memory cell array 101 with a load current IMr necessary for the forming determination for the selected memory cell 102a. Furthermore, a load current source 208b corresponding to the sneak current compensating load current supply unit 8 in the sense amplification circuit 7 supplies the memory cell array 101 with a current corresponding to a sneak current ISr flowing in a non-selected memory cell group 102b. The load current IMr and the sneak current ISr are included in a load current which is supplied to a target memory cell to make a final forming determination. Here, when there is no sneak current, the load current IMr is a current allowing the sense amplification circuit 7 to perform a forming determination for the forming-performed selected memory cell 102a, and the load current IMr has a fixed value regardless of an address of the selected memory cell 102a. On the other hand, the sneak current ISr depends on the sneak current path number m0×m0 which is included in the forming-performed non-selected memory cell group 102b, and the sneak current ISr serves as noise-like component disturbing a reading operation.

However, as explained with reference to FIGS. 5A to 5L, the sneak current path number can be previously calculated for an address of each target memory cell 102a (each selected memory cell 102a), based on an address path of target selected memory cells 102a (in other words, an order of selecting target memory cells). Therefore, based on the relationship between a sneak current path number and a sneak current as shown in FIG. 8, the load current source 208b supplies, as a compensating current, a current corresponding to a sneak current ISr that corresponds to the sneak current path number for each time (for each selected memory cell 102a). Thereby, influence of the sneak current can be eliminated. As a result, it is possible to stably perform a forming determination for a target selected memory cell 102a.

It should be noted that it has been described with reference to FIG. 9A that the load current source 208a and the load current source 208b are two separate load circuits. However, it is also possible that the load current source 208a and the load current source 208b may be implemented as a single load circuit, and a load current (driving current) of the single load circuit is adjusted according to FIG. 9A to be supplied to the memory cell array 101.

Figure 9B:
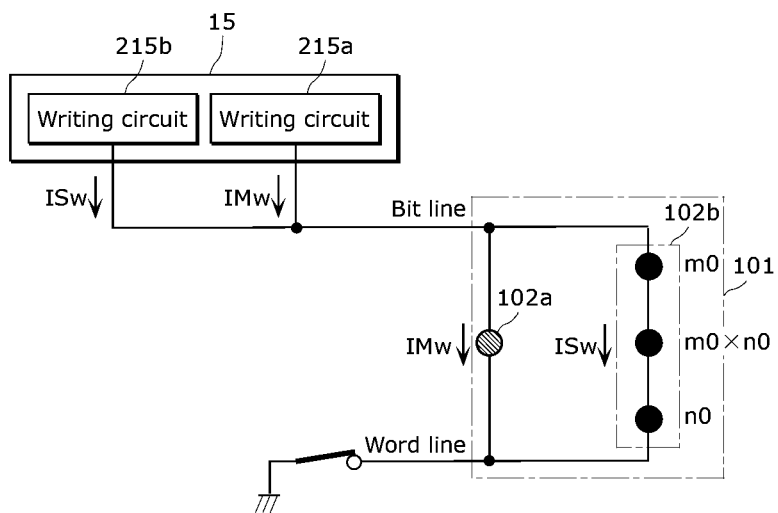
FIG. 9B is a diagram for explaining a writing circuit according to the embodiment of the present invention.

FIG. 9B explains a concept in the case where the present invention is applied to a pulse applied in forming (forming pulse).

When forming is to be performed on the selected memory cell 102a, the writing circuit 215a in the writing circuit 15 supplies the memory cell array 101 with a forming current IMw necessary for forming on the selected memory cell 102a. At the same time, the writing circuit 215b supplies the memory cell array 101 also with a current corresponding to a sneak current ISw flowing in non-selected memory cell group 102b. The forming current IMw and the sneak current ISw are included in a final forming current to be supplied to a target memory cell. Here, the forming current IMw is a current allowing a selected memory cell 102a to be formed in the state where there is no sneak current, and the forming current IMw has a fixed value regardless of an address of the selected memory cell 102a. On the other hand, the sneak current ISw depends on the sneak current path number m0×n0 which is included in the forming-performed non-selected memory cell group 102b, and the sneak current ISw decreases a forming current flowing into the target selected memory cell 102a and eventually disturbs a forming operation.

However, as explained with reference to FIGS. 5A to 5L, the sneak current path number can be previously calculated for an address of each target memory cell 102a (each selected memory cell 102a), based on an address path of target memory cells 102a. Therefore, according to the relationship between a sneak current path number and a sneak current as shown in FIG. 8, the writing circuit 215b supplies, as a compensating current, a current corresponding to the sneak current ISw that corresponds to the sneak current path number for each time (for each selected memory cell 102a), thereby eliminating the influence of the sneak current. As a result, it is possible to achieve stable forming on a selected memory cell 102a.

It should be noted that it has been described that the writing circuit 215a and the writing circuit 215b are two separate writing circuits. However, it is also possible that the writing circuit 215a and the writing circuit 215b may be implemented as a single writing circuit, and a forming current of the single writing circuit is adjusted according to FIG. 9B to be supplied to the memory cell array 101.

Based on the above explanation, the forming method performed by the nonvolatile memory device 100 according to the present invention is described below.

[Method for Forming Determination by Nonvolatile Memory Device]

First, the description is given for an example (example of FIG. 9A) of setting a load current for a forming determination according to a sneak current path number, in forming performed by the nonvolatile memory device 100.

Figure 10A:
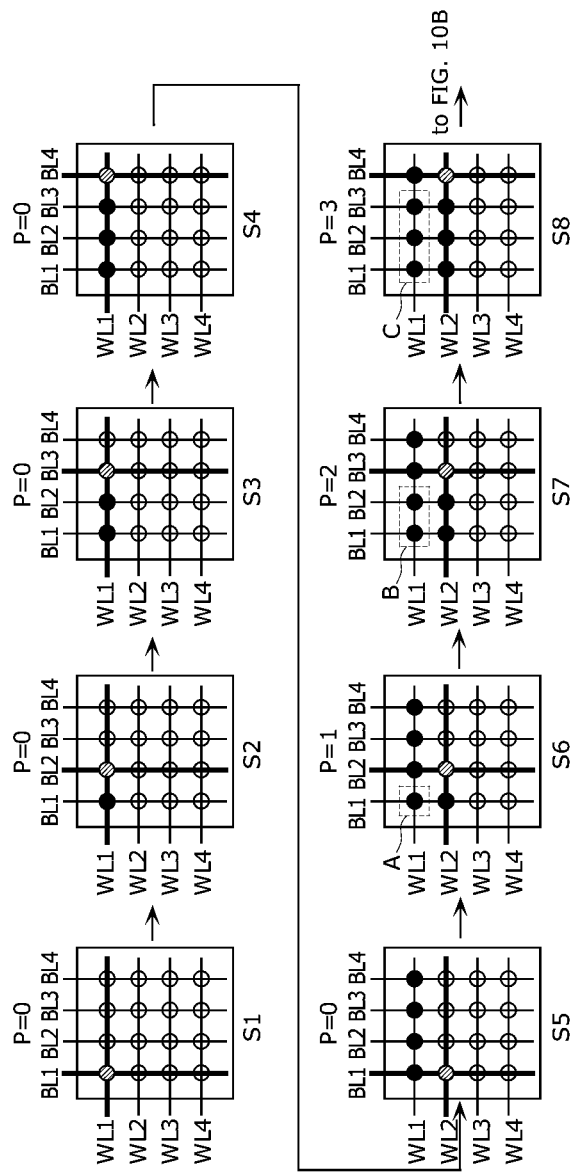
FIG. 10A is a diagram showing a first half of the forming process of the 4×4 memory cell array according to the embodiment of the present invention.
Figure 10B:
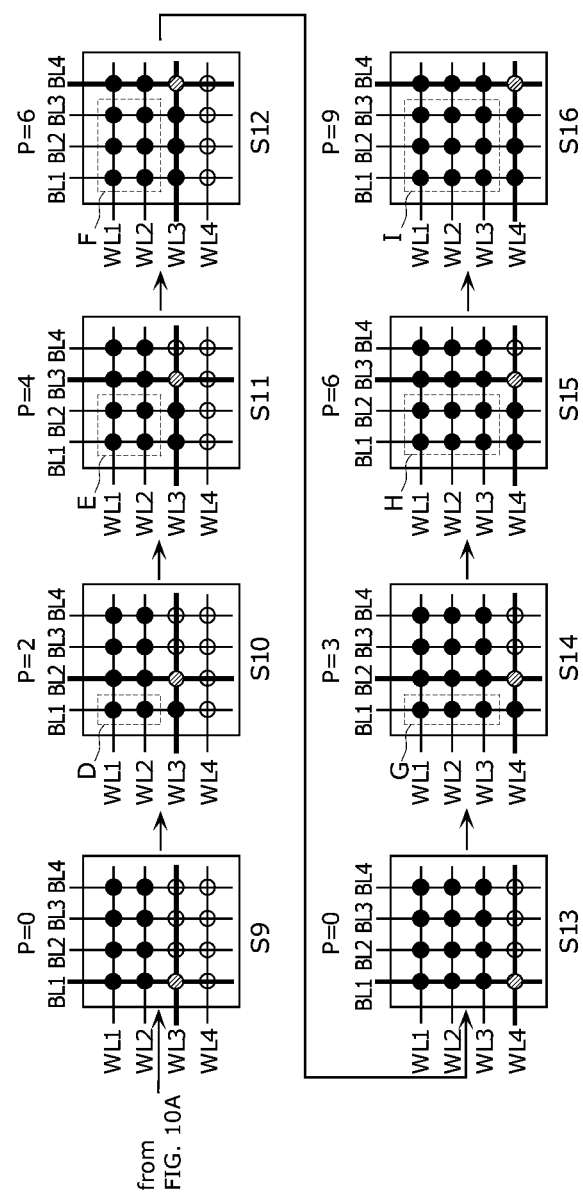
FIG. 10B is a diagram showing a latter half of the forming process of the 4×4 memory cell array according to the embodiment of the present invention.

FIGS. 10A and 10B show an address order for forming (forming order) and a sneak current path number in each situation, regarding 16-bit memory cells 2 arrayed in the memory cell array 1 before forming after manufacturing. In FIGS. 10A and 10B, arrows show a flow of changing a target memory cell 2. Furthermore, a symbol P represents a sneak current path number.

In FIGS. 10A and 10B, memory cells 2 are scanned by sequentially selecting a target bit line in a word line direction (the right direction) without changing a selected word line. Then, after selecting a maximum address in the word line direction, a selected word line is switched to a next word line in a bit line direction (downward direction), and then a target bit line is sequentially selected in the word line direction. This scan method is an example, and the present invention is not limited to this method.

First, at Step S1, a predetermined voltage is applied between a target word line 3 (WL1) and a target bit line 4 (BL1), so as to perform forming on a target memory cell 2 (M11). At this step, the sneak current path number P is 0.

Next, at Step S2, a predetermined voltage is applied between the target word line 3 (WL1) and a next target bit line 4 (BL2), so as to perform forming on a next target memory cell 2 (M12). At this step, although the memory cell 2 (M11) has been formed, the sneak current path number P is still 0.

Then, in forming on each of memory cells 2 (M13, M14, and M21) at Steps S3 to S5, forming is performed in the same manner as each of Steps S1 to S2. Therefore, the forming is not explained again in detail. At each of Steps S3 to S5, the sneak current path number P is still 0.

Next, in forming on a memory cell 2 (M22) at Step S6, a forming-performed memory cell region (A in FIG. 10A) shown by a broken line serves as a sneak current path. As a result, the sneak current path number P becomes 1.

Next, in forming on a memory cell 2 (M23) at Step S7, a forming-performed memory cell region (B in FIG. 10A) serves as a sneak current path. As a result, the sneak current path number P is 2.

Next, in forming on a memory cell 2 (M24) at Step S8, a forming-performed memory cell region (C in FIG. 10A) serves as a sneak current path. As a result, the sneak current path number P is increased to 3.

Next, in FIG. 10B, at Step S9, a selected word line is switched from the word line 3 (WL2) to a word line 3 (WL3), and forming is performed on a memory cell 2 (M31). In the forming on the memory cell 2 (M31), there is no forming-performed memory cell region serving as a sneak current path. Therefore, the sneak current path number P becomes 0.

Next, in forming on a memory cell 2 (M32) at Step S10, a forming-performed memory cell region (D in FIG. 10B) serves as a sneak current path. As a result, the sneak current path number P is 2.

Next, in forming on a memory cell 2 (M33) at Step S11, a forming-performed memory cell region (E in FIG. 10B) serves as a sneak current path. As a result, the sneak current path number P is 4.

Next, in forming on a memory cell 2 (M34) at Step S12, a forming-performed memory cell region (F in FIG. 10B) serves as a sneak current path. As a result, the sneak current path number P is increased to 6.

Next, at Step S13, a selected word line is switched from frown the word line 3 (WL3) to a word line 3 (WL4), and forming is performed on a memory cell 2 (M41). In the forming on the memory cell 2 (M41), there is no forming-performed memory cell region serving as a sneak current path. Therefore, the sneak current path number P becomes 0.

Next, in forming on a memory cell 2 (M42) at Step S14, a forming-performed memory cell region (G in FIG. 10B) serves as a sneak current path. As a result, the sneak current path number P is 3.

Next, in forming on a memory cell 2 (M42) at Step S15, a forming-performed memory cell region (H in FIG. 10B) serves as a sneak current path. As a result, the sneak current path number P is 6.

Finally, in forming on a memory cell 2 (M44) at Step S16, a forming-performed memory cell region (I in FIG. 10B) serves as a sneak current path. As a result, the sneak current path number P reaches a maximum value of 9.

Figures 11, 12:
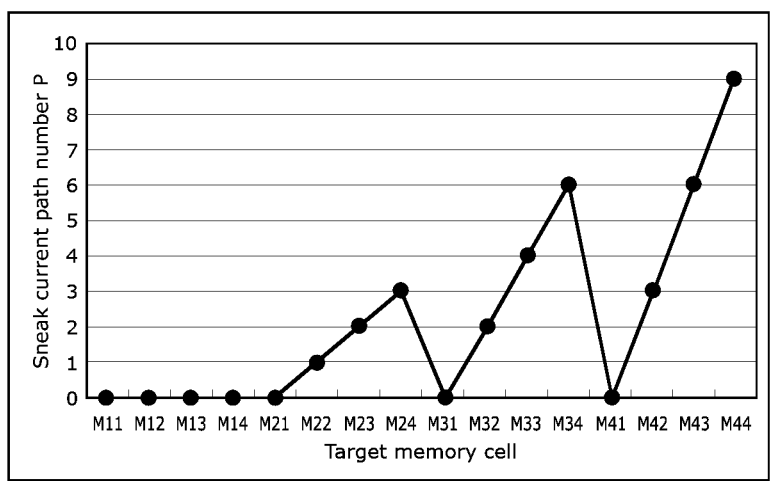
FIG. 11 is a diagram for explaining transition of a sneak current path number corresponding to the forming process of the 4×4 memory cell array according to the embodiment of the present invention.
FIG. 12 is a diagram showing a relationship between a load current control voltage LA(M) and the sneak current path number according to the embodiment of the present invention.

FIG. 11 is a graph plotting transition of the sneak current path number P in the above explanation with reference to FIGS. 10A and 10B.

The number of forming-performed memory cells 2 is monotonically increased as the forming progresses. However, as shown in FIG. 11, the sneak current path number is not monotonically increased, but repeats increase and decrease. The sneak current path number has a discrete value, such as 0, 1, 2, 3, 4, 6, or 9, according to a position of a target memory cell 2.

FIG. 12 is a table indicating a relationship between a load current control voltage LA(M) and a sneak current path number. The load current control voltage LA(M) is set to a gate terminal of the P-type MOS transistor 8b in the sneak current compensating load current supply unit 8.

As shown in FIG. 12, LA(1) to LA(7) each representing the load current control voltage LA(M) that is an output of the variable voltage source 16 are in association with the discrete sneak current path numbers 0, 1, 2, 3, 4, 6, and 9, respectively. As a result, depending on a sneak current path number in forming on a target memory cell 2, the sneak current compensating load current supply unit 8 can set a load current to be supplied for a forming determination.

Figure 13:
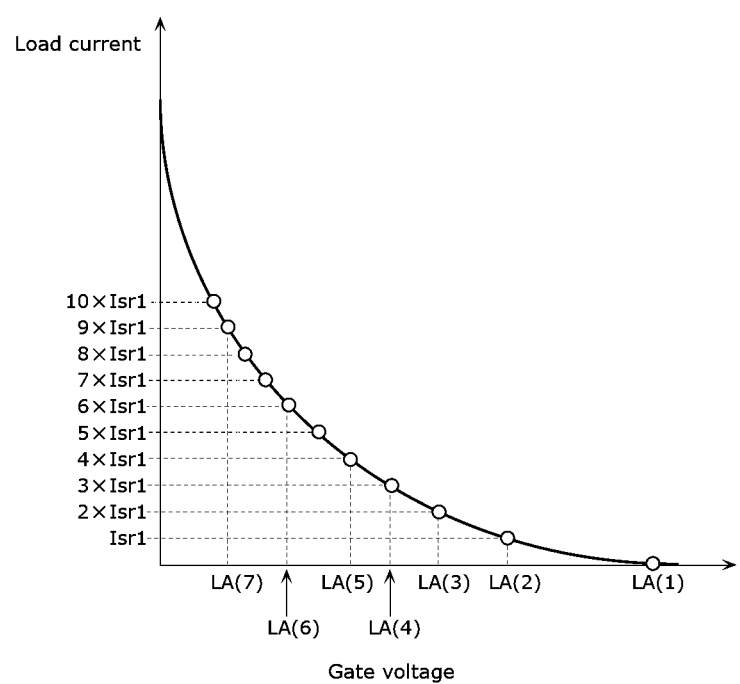
FIG. 13 is a graph for explaining a relationship between a gate voltage and an output current of a load current supply transistor according to the embodiment of the present invention.

FIG. 13 shows voltage-current properties (V-I properties) indicating a relationship between a load current flowing in the P-type MOS transistor 8b and a load current control voltage LA(M) applied to the gate terminal of the P-type MOS transistor 8b. FIG. 13 shows an integral multiple of a current value of a sneak current ISr1 and a value of a gate voltage (hereinafter, referred to as a "gate voltage value") associated with the integral multiple. The sneak current ISr1 is a sneak current to be supplied from the sneak current compensating load current supply unit 8 to make a forming determination, when the sneak current path number is 1.

In the V-I properties in FIG. 13, no sneak current flows when the sneak current path number is 0, Therefore, the gate voltage value LA(1) is in association with a load current 0. However, the sneak current is increased in proportional to the sneak current path number. Therefore, when the sneak current path number is 1, the gate voltage value LA(2) is in association with a load current 1×Is. When the sneak current path number is 2, the gate voltage value LA(3) is in association with a load current 2×Is. When the sneak current path number is 3, the gate voltage value LA(4) is in association with a load current 3×Is. When the sneak current path number is 4, the gate voltage value LA(5) is in association with a load current 4×Is. When the sneak current path number is 6, the gate voltage value LA(6) is in association with a load current 6×Is. When the sneak current path number is 9, the gate voltage value LA(7) is in association with a load current 9×Is.

Here, the structure of setting a load current for a forming determination according to the sneak current path number is achieved by designing the variable voltage source 16 so that the voltage values shown in FIG. 1B satisfy the relationship in FIG. 13 and storing the table indicating the relationships in FIGS. 11 and 12 to the storage unit 30. More specifically, based on the table indicating the relationships in FIGS. 11 and 12 as stored by the control circuit 18 into the storage unit 30, the variable voltage source 16 is controlled.

It should be noted that, for example, the variable voltage source 16 has a structure capable of setting more various voltages, and that the above-described gate voltage value necessary for a forming stage is set by a program. It is also possible that a voltage at the gate terminal of the P-type MOS transistor 8b is not supplied from the variable voltage source 16 but that a DC voltage is supplied directly from the outside of the nonvolatile memory device 100. In this case, the nonvolatile memory device 100 is electrically connected to the gate terminal of the P-type MOS transistor 8b, and has an external voltage application terminal receiving a voltage that is selected from among various different voltages. The control circuit 18 adjusts a voltage value to be applied to the external voltage application terminal so as to adjust an output current of the P-type MOS transistor 8*b*, eventually adjusting a load current to be supplied to the sneak current compensating load current supply unit 8.

Next, the description is given for a forming method (driving method) performed in the nonvolatile memory device 100 including variable resistance elements having the forming characteristics as shown in FIG. 3B.

Figure 14:
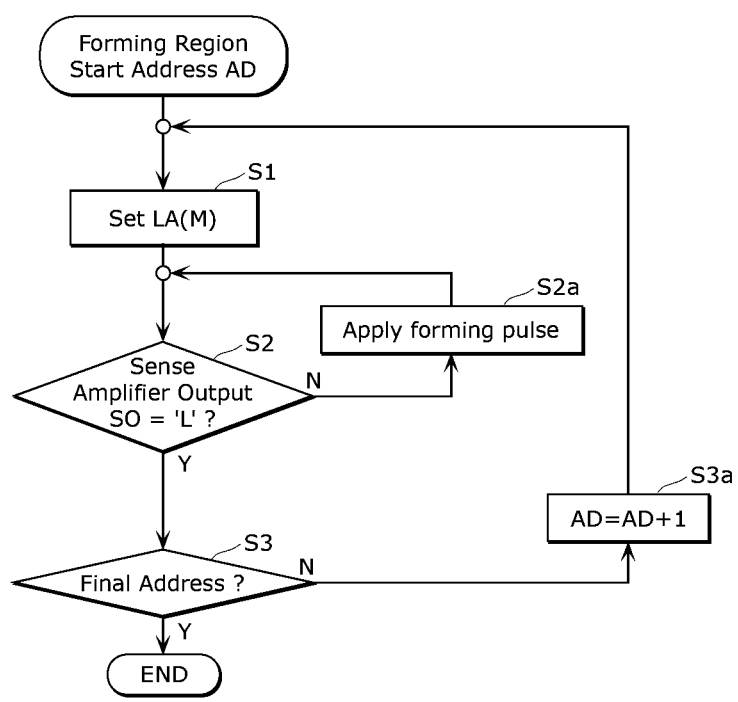
FIG. 14 is a flowchart of forming according to the embodiment of the present invention.

FIG. 14 is a flowchart of steps in the forming.

In the forming method on a memory cell 2, first, a beginning address in a target region is designated (selected) as a target memory cell 2 for forming.

Next, a value of a load current supplied from the sneak current compensating load current supply unit 8 and the reading current detection load current supply unit 9, in other words, supplied from the sense amplification circuit 7 is changed (set) according to the number and the positions of memory cells 2 which do not include the target memory cell 2 in the memory cell array 1 and which are in the second resistance state. In other words, the first step (Step S1) is performed to set a gate voltage of the sneak current compensating load current supply unit 8 according to the sneak current path number of a target memory cell 2. After that, the resulting load current is supplied to the target memory cell 2, and the second step (Step 2) is thereby performed to determine whether or not an output of the sense amplification circuit 7 is 'L' level (in other words, it is confirmed whether the output is 'H' level).

Here, at the first step, a value of the load current is changed (set) in proportional to the number of memory cells 2 in the second resistance state among memory cells 2 each located at a corresponding crosspoint between a word line 3 connected to the previously-described first memory cell and a bit line 4 connected to the previously-described second memory cell. At the second step, a forming pulse has not yet been applied to a target memory cell 2, and it is therefore expected that an output of the sense amplification circuit 7 is 'H' level. If the output of the sense amplification circuit 7 is 'L' level at this stage, it is determined that the selected memory cell 2 (target memory cell 2) has already been formed, and the forming is terminated.

Next, after the second step, the third step (Step S2*a*) is performed to supply a forming pulse as a writing current to the target memory cell 2.

Next, after the third step, the fourth step (Step S2) is performed to supply the load current set at the first step (Step S1) to the target memory cell 2, so as to read a resistance state of a variable resistance element in the target memory cell 2.

Next, at the fourth step, if the output of the sense amplification circuit 7 is 'L' level (Y at Step S2), it is determined that the target memory cell 2 has already been formed (the resistance state of the variable resistance element has been changed), and the application of the forming pulse is stopped and the forming on the target memory cell 2 is terminated. On the other hand, if the output of the sense amplification circuit 7 is 'H' level (N at Step S2), it is determined that the target memory cell 2 has not yet been formed (the resistance state of the variable resistance element is not changed), and the third step (Step S2*a*) is performed again.

Next, at the fifth step (Step S3), if forming has already been performed up to a final address in the target region, the forming is terminated. If a target to be formed is not the final address, the processing proceeds to a next address (Step S3*a*), and the forming is repeated from the first step (Step S1) for the memory cell 2.

The following describes the forming method shown in FIG. 14 in more detail. In the forming method, forming is performed according to the forming order shown in FIGS. 10A and 10B.

First, a target region to be formed is determined. A memory cell 2 (M11) having a beginning address in the determined region is designated as a target memory cell 2 (selected memory cell 2).

Next, a gate voltage of the sneak current compensating load current supply unit 8 is set according to a sneak current path number of the target memory cell 2 (M11) (Step S1). Since the sneak current path number in the case of forming on the memory cell 2 (M11) is 0, a load current control voltage LA(M) that is an output of the variable voltage source 16 is set to the gate voltage LA(1) according to FIG. 12.

Next, the sense amplification circuit 7 reads information (resistance state) of the memory cell 2 (M11). Then, a branch determination is made according to a result of the output SO of the sense amplification circuit 7 in order to determine whether or not the memory cell 2 (M11) is in the state where reversible resistance change is possible (Step S2). More specifically, after supplying a current to the memory cell array 1 under the condition set at Step S1, it is determined whether or not the output SO of the sense amplification circuit 7 has been changed from 'H' level to 'L' level.

Next, if the output SO of the sense amplification circuit 7 is 'L' level (Y at Step S2), it is determined that the memory cell 2 (M11) is in the state where reversible resistance change is possible (in other words, the memory cell 2 (M11) is in the second resistance state having a lower resistance value than a resistance value of the first resistance state), and then the processing proceeds to a next step. On the other hand, if the output SO of the sense amplification circuit 7 is 'H' level (N at Step S2), it is determined that the memory cell 2 (M11) is in the first resistance state having a higher resistance value than a resistance value of the second resistance state, and a forming pulse is applied to the memory cell 2 (M11) (Step S2*a*). Then, until the output of the sense amplification circuit 7 becomes 'L' level, or until the predetermined number of forming pulse application executions have been performed, the above processing is repeated.

Next, it is determined whether or not the address indicating the memory cell 2 (M11) is a final address in the forming region (Step S3). If the address indicating the memory cell 2 (M11) is not a final address (N at Step S3), then the processing proceeds to a next address (Step S3*a*), and the above processing is repeated from Step S1. Since the final address indicates a memory cell 2 (M44) not the memory cell 2 (M11), the above processing is repeated from Step S1 for a memory cell 2 (M12) having an address next to the memory cell 2.

In forming of and subsequent to the address of the memory cell 2 (M12), the sneak current path number is 0 for memory cells 2 (M12 to M21). Therefore, at Step S1, the load current control voltage LA(M) that is an output of the variable voltage source 16 is set to the gate voltage LA(1). The above-described processing of Steps S1, S2, S3, and S3*a* is repeated for each of the memory cells 2 (M12 to M21).

However, in the case of the memory cell 2 (M22), the sneak current path number is increased to 1. Therefore, at Step 1 in the forming on the memory cell 2 (M22), the load current control voltage LA(M) that is an output of the variable voltage source 16 is set to the gate voltage LA(2). Then, in the forming on the memory cell 2(M22), the above-described Steps S2, S3, and S3*a* are performed.

Likewise, in the forming of and subsequent to the memory cell 2 (M23), a gate voltage (gate voltage setting value) in association with an address of a target memory cell 2 is set as the load current control voltage LA(M) that is an output of the variable voltage source 16 according to FIGS. 11 and 12, and the above-described Steps S2, S3, and S3a are performed for the target memory cell 2. Then, in the forming of the memory cell 2 (M44), if the determination result is Y at Step S3, the forming is terminated.

[Forming Voltage Setting Method for Crosspoint Nonvolatile Memory Device]

Next, the description is given for an example (example in FIG. 9B) of setting a forming current according to a sneak current path number, in forming of the nonvolatile memory device 100. Hereinafter, it is assumed that forming is performed according to the forming order shown in FIGS. 10A and 10B. Therefore, the sneak current path number is changed for each target address in the same manner as shown in FIGS. 10A and 10B, the changes of the sneak current path number are not explained again below.

Figures 15, 16:
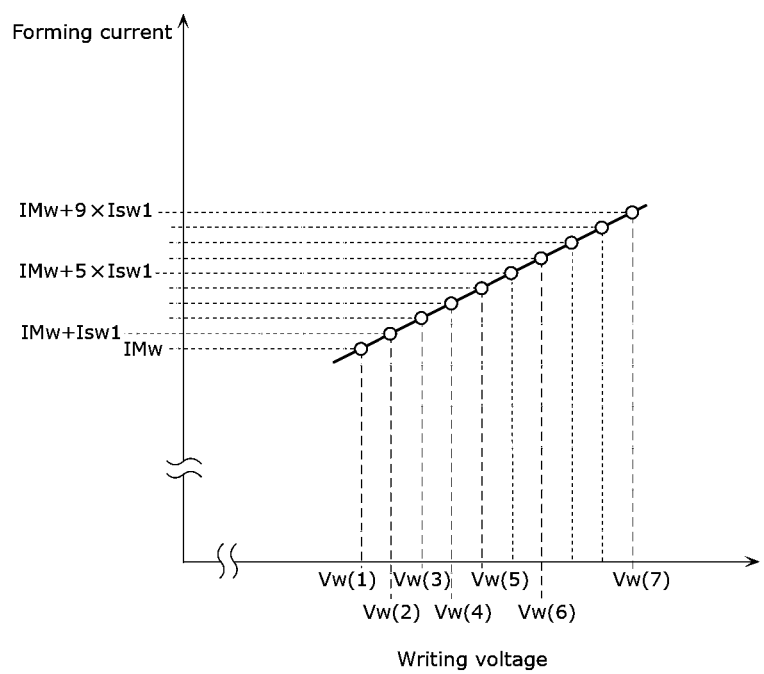
FIG. 15 is a table showing a relationship between a voltage Vw(M) and a sneak current path number according to the embodiment of the present invention.
FIG. 16 is a graph for explaining a relationship between a voltage Vw(M) and an output current (forming current) of a writing circuit according to the embodiment of the present invention.

FIG. 15 shows a relationship between a pulse voltage Vw(M) applied to the writing circuit 15 and a sneak current path number.

As seen in FIG. 15, discrete sneak current path numbers 0, 1, 2, 3, 4, 6, and 9 are in association with pulse voltages Vw(1) to Vw(7), respectively. As a result, depending on a sneak current path number in forming on a target memory cell 2, it is possible to change a forming current supplied to the writing circuit 15 to perform forming.

FIG. 16 shows voltage-current properties (V-I properties) indicating a relationship between a pulse voltage Vw(M) applied to the writing circuit 15 and an output current (forming current) of the writing circuit 15. In FIG. 16, a forming current IMw is a current necessary for forming on a selected memory cell when there is no sneak current path, and a sneak current ISw1 is a sneak current supplied from the writing circuit 15 to perform forming, when the sneak current path number is 1. FIG. 16 shows (a) an integral multiple of a current value of a sneak current ISw1 and (b) a pulse voltage Vw(M) associated with the integral multiple.

In the V-I properties in FIG. 16, no sneak current flows when the sneak current path number is 0. Therefore, the pulse voltage Vw(1) is set as a voltage causing an output current IMw of the writing circuit 15. However, a sneak current is increased in proportional to a sneak current path number. Therefore, when the sneak current path number is 1, a pulse voltage Vw(2) is set as a voltage for causing an output current IMw+ISw1. When the sneak current path number is 2, a pulse voltage Vw(3) is set as a voltage for causing an output current IMw+2×ISw1. When the sneak current path number is 3, a pulse voltage Vw(4) is set as a voltage for causing an output current IMw+3×ISw1. When the sneak current path number is 4, a pulse voltage Vw(5) is set as a voltage for causing an output current IMw+4×ISw1. When the sneak current path number is 6, a pulse voltage Vw(6) is set as a voltage for causing an output current IMw+6×ISw1. When the sneak current path number is 9, a pulse voltage Vw(7) is set as a voltage for causing an output current IMw+9×ISw1.

Here, the structure of setting a forming current according to the sneak current path number is achieved by storing the table indicating the relationships in FIGS. 11 and 15 to the storage unit 30. More specifically, based on the table indicating the relationships in FIGS. 11 and 15 as stored by the control circuit 18 into the storage unit 30, the pulse voltage source Vw(M) is controlled.

Next, the description is given for a forming method (driving method) performed in the nonvolatile memory device 100 including variable resistance elements having the forming characteristics as shown in FIG. 3B.

Figure 17:
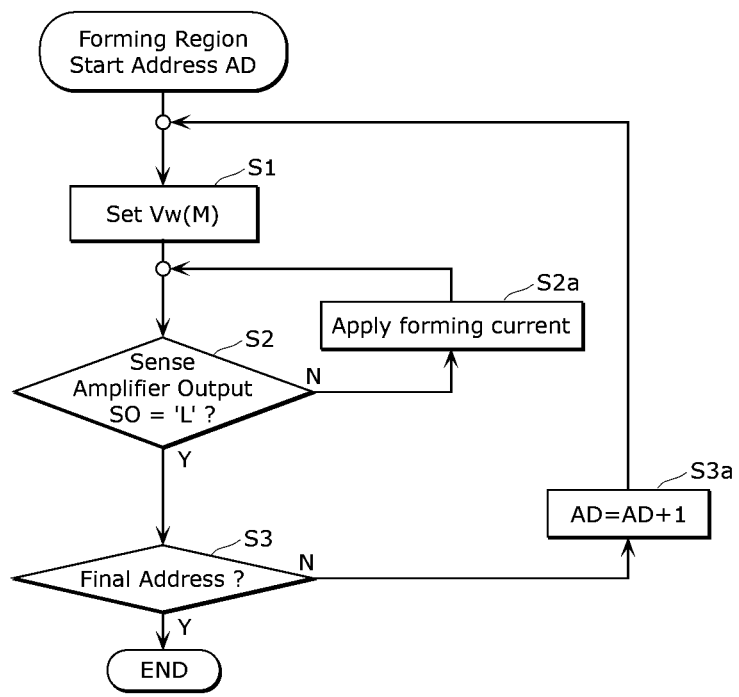
FIG. 17 is a flowchart of forming according to the embodiment of the present invention.

FIG. 17 is a flowchart of steps in the forming.

In the forming method on a memory cell 2, first, a beginning address in a target region is designated (selected) as a target memory cell 2 for forming.

Next, the first step (Step S1) is performed to change a value of a forming pulse as a writing current supplied from the writing circuit 15, according to the number and positions of memory cells 2 each including a variable resistance element in the second resistance state except the selected memory cell 2 in the memory cell array 1. In other words, the first step (Step S1) is performed to set a forming current according to the sneak current path number of a target memory cell 2. After that, a predetermined load current is supplied to the selected memory cell 2, and the second step (Step 2) is thereby performed to determine whether or not an output of the sense amplification circuit 7 is 'L' level (in other words, it is confirmed whether the output is 'H' level).

Here, at the first step, a value of the forming pulse is changed in proportional to the number of memory cells 2 in the second resistance state among memory cells 2 each located at a corresponding crosspoint between a word line 3 connected to the previously-described first memory cell and a bit line 4 connected to the previously-described second memory cell. At the second step, a forming pulse has not yet been applied to a target memory cell 2, and it is therefore expected that an output of the sense amplification circuit 7 is 'H' level. If the output of the sense amplification circuit 7 is 'L' level at this stage, it is determined that the selected memory cell 2 (target memory cell 2) has already been formed, and the forming is terminated.

Next, after the second step, the third step (Step S2a) is performed to supply the forming pulse changed at the first step to the target memory cell 2.

Next, after the third step, the fourth step (Step S2) is performed to supply a predetermined load current from the sense amplification circuit 7 to the target memory cell 2, so as to read a resistance state of a variable resistance element in the target memory cell 2.

Next, at the fourth step, if the output of the sense amplification circuit 7 is 'L' level (Y at Step S2), it is determined that the target memory cell 2 has already been formed (the resistance state of the variable resistance element has been changed), and the application of the forming pulse is stopped and the forming on the target memory cell 2 is terminated. On the other hand, if the output of the sense amplification circuit 7 is 'H' level (N at Step S2), it is determined that the target memory cell 2 has not yet been formed (the resistance state of the variable resistance element is not changed), and the third step (Step S2a) is performed again.

Next, at the fifth step (Step S3), if forming has already been performed up to a final address in the target region, the forming is terminated. If a target to be formed is not the final address, the processing proceeds to a next address (Step S3a), and the forming is repeated from the first step (Step S1) for the next address.

The forming method shown in FIG. 17 differs from the forming method shown in FIG. 14 only in the following point. While, in the forming method shown in FIG. 14, a load current value to be used for a forming determination is changed (set) according to a sneak current path number of a target memory cell, in the forming method shown in FIG. 17, however, a forming current value is changed (set) according to a sneak current path number of a target memory cell. Therefore, the forming method shown in FIG. 17 is not described in detail.

It should be noted that the structure of switching a forming current in FIG. 17 according to a sneak current path number may be combined with the structure of switching a load current value in FIG. 14 according to a sneak current path number. In other words, it is possible to switch both a forming current and a load current value, which are used in forming on a target memory cell 2, according to an address of the target memory cell 2.

As described above, according to the crosspoint nonvolatile memory device according to the present embodiment, depending on an address of a target memory cell 2, at least one of a forming current and a load current value which is used in forming on the target memory cell 2 is switched to an appropriate one in consideration of a sneak current path number of the address. As a result, it is possible to eliminate influence of a sneak current in forming and thereby perform stable forming.

Thus, the crosspoint nonvolatile memory device and the method of driving the crosspoint nonvolatile memory device according to the present invention have been described with reference to the embodiment. However, the present invention is not limited to the embodiment. Those skilled in the art will be readily appreciated that various modifications of the embodiment and combinations of structural elements in different embodiments are possible without materially departing from the novel teachings and advantages of the present invention. Accordingly, all such modifications and combinations are intended to be included within the scope of the present invention.

For example, it has been described in the present embodiment that a forming current value is switched to an appropriate value. This is because a memory cell that has not been formed is in the super high resistance state but a memory cell that has already been formed has a resistance value that is much lower than a resistance value of the super high resistance state, so that memory cells that have already been formed are more dominant and memory cell that have not been formed can be ignored in terms of impedance of a sneak current path. Therefore, the present invention is applied not only to the forming, but also to writing and reading for a memory cell in the case where the memory cell has at least two writing states, such as high resistance writing and low resistance writing, and a resistance value of the memory cell in the high resistance writing state (high resistance state) is much higher than a resistance value of the memory cell in the low resistance writing state (low resistance state). In general, a resistance value in the high resistance state is no lower than ten times a resistance value in the low resistance state. Therefore, if a current flowing into a memory cell in the high resistance state can be relatively ignored, it can be considered that the sneak current path number consists only of memory cells in the low resistance state in the present invention.

In this case, a variable resistance element is reversibly changeable between the low resistance state and the high resistance state. A writing current or a writing voltage is an electrical signal that causes the variable resistance element in the selected memory cell to be reversibly changeable between the low resistance state and the high resistance state. A load current is a current for checking whether the variable resistance element in the selected memory cell is in the low resistance state or in the high resistance state. In other words, in the above-described embodiment, the forming can be replaced by general writing to a memory cell, the forming determination can be replaced by reading of information from a memory cell, the forming pulse can be replaced by an electrical signal that causes the reversible change between the low resistance state and the high resistance state, and the load current for the forming determination is replaced by a load current for checking whether the resistance state is in the low resistance state or in the high resistance state. Therefore, when the first resistance state is the high resistance state and the second resistance state is the low resistance state, an electrical signal is switched to an appropriate one according to an address of a target memory cell to be written, thereby causing a current or a voltage in association with a sneak current path of the address of the target memory cell. Furthermore, according to an address of a target memory cell to be read, a load current is switched to an appropriate one to cause a current in association with a sneak current path of the address.

It should also be note that a sneak current provided from the sneak current compensating load current supply unit 8 and a load current provided from the data "0" verification load current supply unit 10 or the data "1" verification load current supply unit 11 are included in a final load current to be supplied to a target memory cell to read information from the target memory cell. Furthermore, a writing current provided from the writing circuit 15 is a final electrical signal to be supplied to a target memory cell to write information into the target memory cell.

It should also be noted that the present invention may be applied to a nonvolatile memory device having a regularity in selecting a memory cell is to be written and read, so that it is possible to easily determine which memory cell(s) is/are in the low resistance state among memory cells except the memory cell to be written and read.

It should also be note that it has been described in the present embodiment that a forming pulse is a writing current and forming on a selected memory cell is performed by applying the current to the selected memory cell. However, it is also possible that a forming pulse is a writing voltage and forming on a selected memory cell is performed by applying the voltage to the selected memory cell. In this case, the writing circuit applies the writing voltage that is changed in proportional to a sneak current path number.

It should also be note that it has been described in the present embodiment that a sneak current is supplied (modified) according to a sneak current path number for each address. However, in the case of a large memory cell array, a change amount of a sneak current for each address is small. Therefore, Step 1 in FIGS. 14 and 17 is performed for a set of addresses in a predetermined two or more number, so as to simplify the forming.

INDUSTRIAL APPLICABILITY

The crosspoint nonvolatile memory device and the method of driving the crosspoint nonvolatile memory device according to the present invention are capable of cancelling a sneak current inherent in the crosspoint nonvolatile memory device to achieve stable forming. Therefore, the present invention is useful as a nonvolatile semiconductor memory device used in various electronic devices, such as digital home appliances, memory cards, mobile phones, and personal computers.

REFERENCE SIGNS LIST 1, 101, 110 memory cell array
2 memory cell
2a variable resistance element
2b diode element
3 word line
4 bit line
5 row selection circuit
6 column selection circuit
7 sense amplification circuit
8 sneak current compensating load current supply unit
8a, 8b, 9a, 9b, 10a, 10b, 11a, 11b P-type MOS transistor 9 reading current detection load current supply unit
10 data "0" verification load current supply unit
11 data "1" verification load current supply unit
12 clamp N-type MOS transistor
13 clamp voltage control circuit
14 difference amplifier
15 writing circuit
16, 17 variable voltage source
18 control circuit
19 fixed resistance element
20 load current control voltage selection switch
21 first via
22 first electrode
23 semiconductor layer
24 second electrode
25 first variable resistance layer
26 second variable resistance layer
27 third electrode
28 second via
29 insulation layer
30 storage unit
100 nonvolatile memory device
102a selected memory cell
102b non-selected memory cell group
103 selected word line
104 selected bit line
105 crosspoint region
106a, 106b forming-performed memory cell region
111 data line drive circuit
112 bit line drive circuit
113 row decoder
114 column decoder
115 sense circuit
120a, 120b reference memory cell array
208a, 208b load current source
215a, 215b writing circuit

The invention claimed is:

1. A crosspoint nonvolatile memory device comprising:
a plurality of word lines parallel to each other on a first plane;
a plurality of bit lines parallel to each other on a second plane parallel to the first plane, the bit lines three-dimensionally crossing the word lines;
a crosspoint memory cell array including memory cells arranged in rows and columns at respective three-dimensional crosspoints between the word lines and the bit lines, each of the memory cells including a variable resistance element changeable between two resistance states which are a first resistance state and a second resistance state that has a lower resistance value than a resistance value of the first resistance state;
a word line selector that selects a word line from the word lines;
a bit line selector that selects a bit line from the bit lines;
a writing circuit that supplies a writing current or a writing voltage to change a resistance state of a variable resistance element in a selected memory cell, the selected memory cell being selected by selecting the bit line by the bit line selector and selecting the word line by the word line selector;
a sense amplification circuit that supplies a load current to the selected memory cell to read the resistance state of the variable resistance element in the selected memory cell; and
a control circuit that controls the sense amplification circuit and the writing circuit, wherein, in the crosspoint memory cell array, (A) at least one memory cell including a variable resistance element in the second resistance state among one or more memory cells connected to the bit line selected by the bit line selector except the selected memory cell is determined as at least one first memory cell, and (B) at least one memory cell including a variable resistance element in the second resistance state among one or more memory cells connected to the word line selected by the word line selector except the selected memory cell is determined as at least one second memory cell, and
the control circuit changes the value of the at least one of (a) the writing current or the writing voltage and (b) the load current, in proportion to the total number of one or more memory cells including a variable resistance element in the second resistance state among one or more memory cells each located at a crosspoint between a word line connected to a corresponding one of the at least one first memory cell and a bit line connected to a corresponding one of the at least one second memory cell.

2. The crosspoint nonvolatile memory device according to claim 1,
wherein the control circuit performs the changing for the load current, and
the sense amplification circuit includes a load current source that selects a load current from among load currents having different current amounts and supplies the selected load current to the bit line selected by the bit line selector as the load current changed by the control circuit, the sense amplification circuit (i) outputting a first logical value when a current amount flowing into the selected bit line is more than a reference current amount and (ii) outputting a second logical value when the current amount is less than the reference current amount.

3. The crosspoint nonvolatile memory device according to claim 2,
wherein the sense amplification circuit includes a differential amplifier that (i) compares a voltage at the selected bit line to a reference voltage, and (ii-1) outputs the second logical value when the voltage at the selected bit line is higher than the reference voltage and (ii-2) outputs the first logical value when the voltage is lower than the reference voltage, and
the sense amplification circuit outputs:
the first logical value, when the variable resistance element in the selected memory cell is in the second resistance state and the load current changed by the control circuit is supplied to the selected memory cell, and
the second logical value, when the variable resistance element in the selected memory cell is in the first resistance state and the load current changed by the control circuit is supplied to the selected memory cell.

4. The crosspoint nonvolatile memory device according to claim 3,
wherein the load current source includes a Metal Oxide Semiconductor (MOS) transistor,
the crosspoint nonvolatile memory device further comprises a variable voltage source that is electrically connected to a gate terminal of the MOS transistor and that selects a voltage from among voltages having different voltage values and applies the selected voltage to the gate terminal,
the load current source selects the load current to be supplied, from among at least a first load current, a second load current, and a third load current having a current amount between a current amount of the first load current and a current amount of the second load current, and (i) when the load current source is to supply the second load current, the control circuit adjusts a value of the selected voltage applied from the variable voltage source to cause an output current of the MOS transistor to be more than an output current of the MOS transistor in a case where the load current source supplies the third load current, and (ii) when the load current source is to supply the third load current, the control circuit adjusts the value of the selected voltage to cause the output current of the MOS transistor to be more than an output current of the MOS transistor in a case where the load current source supplies the first load current.

5. The crosspoint nonvolatile memory device according to claim 3,
wherein the load current source includes a Metal Oxide Semiconductor (MOS) transistor,
the crosspoint nonvolatile memory device is electrically connected to a gate terminal of the MOS transistor, and includes an external voltage application terminal that receives a voltage selected from among various different voltages,
the load current source selects the load current to be supplied, from among at least a first load current, a second load current, and a third load current having a current amount between a current amount of the first load current and a current amount of the second load current, and
(i) when the load current source is to supply the second load current, the control circuit adjusts a value of the voltage applied to the external voltage application terminal to cause an output current of the MOS transistor to be more than an output current of the MOS transistor in a case where the load current source supplies the third load current, and (ii) when the load current source is to supply the third load current, the control circuit adjusts the value of the voltage to cause the output current of the MOS transistor to be more than an output current of the MOS transistor in a case where the load current source supplies the first load current.

6. The crosspoint nonvolatile memory device according to claim 1,
wherein, in an initial state after manufacturing the variable resistance element, the variable resistance element is in the first resistance state, and after forming is performed, the variable resistance element is changed from the initial state to the second resistance state where the variable resistance element is reversibly changeable between a low resistance state and a high resistance state that has a higher resistance value than a resistance value of the low resistance state,
the writing current or the writing voltage is a forming pulse used in the forming on the variable resistance element in the selected memory cell, and
the load current is a current for checking whether application of the forming pulse causes the variable resistance element in the selected memory cell to be in the second resistance state.

7. The crosspoint nonvolatile memory device according to claim 1,
wherein the variable resistance element is reversibly changeable between the first resistance state and the second resistance state,
the writing current or the writing voltage is an electrical signal that causes the variable resistance element in the selected memory cell to be reversibly changeable between the first resistance state and the second resistance state, and
the load current is a current for checking whether the variable resistance element in the selected memory cell is in the first resistance state or in the second resistance state.

8. The crosspoint nonvolatile memory device according to claim 1,
wherein each of the memory cells includes the variable resistance element and a diode element which are connected in series with each other, the diode element comprising nitrogen-deficient silicon nitride.

9. A method of driving a crosspoint nonvolatile memory device, the crosspoint nonvolatile memory device including:
a plurality of word lines parallel to each other on a first plane;
a plurality of bit lines parallel to each other on a second plane parallel to the first plane, the bit lines three-dimensionally crossing the word lines;
a crosspoint memory cell array including memory cells arranged in rows and columns at respective three-dimensional crosspoints between the word lines and the bit lines, each of the memory cells including a variable resistance element changeable between two resistance states which are a first resistance state and a second resistance state that has a lower resistance value than a resistance value of the first resistance state;
a word line selector that selects a word line from the word lines;
a bit line selector that selects a bit line from the bit lines;
a writing circuit that supplies a writing current or a writing voltage to change a resistance state of a variable resistance element in a selected memory cell, the selected memory cell being selected by selecting the bit line by the bit line selector and selecting the word line by the word line selector; and
a sense amplification circuit that supplies a load current to the selected memory cell to read the resistance state of the variable resistance element in the selected memory cell,
wherein, in the crosspoint memory cell array, (A) at least one memory cell including a variable resistance element in the second resistance state among one or more memory cells connected to the bit line selected by the bit line selector except the selected memory cell is determined as at least one first memory cell, and (B) at least one memory cell including a variable resistance element in the second resistance state among one or more memory cells connected to the word line selected by the word line selector except the selected memory cell is determined as at least one second memory cell,
the method of driving the crosspoint nonvolatile memory device, comprising changing the value of the at least one of (a) the writing current or the writing voltage and (b) the load current, in proportion to the total number of one or more memory cells including a variable resistance element in the second resistance state among one or more memory cells each located at a crosspoint between a word line connected to a corresponding one of the at least one first memory cell and a bit line connected to a corresponding one of the at least one second memory cell.

10. The method according to claim 9,
wherein the sense amplification circuit includes a load current source that selects a load current from among load currents having different current amounts and supplies the selected load current to the bit line selected by the bit line selector, the sense amplification circuit (i) outputting a first logical value when a current amount flowing into the selected bit line is more than a reference current amount and (ii) outputting a second logical value when the current amount is less than the reference current amount, in the changing of the value, the changing is performed for the load current to generate a changed load current, and the method further comprising:

supplying the changed load current to the selected memory cell and checking whether or not an output of the sense amplification circuit is the second logical value;

supplying, after the supplying of the changed load current, the writing current or the writing voltage to the selected memory cell; and supplying the changed load current to the selected memory cell and reading the resistance state of the variable resistance element in the selected memory cell, after the supplying of the writing current or the writing voltage, wherein in the supplying of the changed load current after the supplying of the writing current or the writing voltage, when the output of the sense amplification circuit is the first logical value, it is determined that the resistance state of the variable resistance element in the selected memory cell has been changed, and the supplying of the writing current or the writing voltage is terminated, and when the output of the sense amplification circuit is the second logical value, it is determined that the resistance state of the variable resistance element in the selected memory cell has not been changed, and the supplying of the writing current or the writing voltage is performed again.

11. The method according to claim 9, wherein the sense amplification circuit includes a load current source, and (i) outputs a first logical value when a current amount flowing into the bit line selected by the bit line selector is more than a reference current amount and (ii) outputs a second logical value when the current amount is less than the reference current amount, in the changing of the value, the changing is performed for the writing current or the writing voltage to generate the changed writing current or the changed writing voltage, the method comprising:

supplying the load current to the selected memory cell and checking whether or not the output of the sense amplification circuit is the second logical value;

supplying, after the supplying of the load current, the changed writing current or the changed writing voltage to the selected memory cell; and supplying, after the supplying of the changed writing current or the changed writing voltage, the load current to the selected memory cell and reads the resistance state of the variable resistance element in the selected memory cell, wherein in the supplying of the load current after the supplying of the changed writing current or the changed writing voltage, when the output of the sense amplification circuit is the first logical value, it is determined that the resistance state of the variable resistance element in the selected memory cell has been changed, and the supplying of the changed writing current or the changed writing voltage is terminated, and when the output of the sense amplification circuit is the second logical value, it is determined that the resistance state of the variable resistance element in the selected memory cell has not been changed, and the supplying of the changed writing current or the changed writing voltage is performed again.

12. The method according to claim 9, wherein, in an initial state after manufacturing the variable resistance element, the variable resistance element is in the first resistance state, and after forming is performed, the variable resistance element is changed from the initial state to the second resistance state where the variable resistance element is reversibly changeable between a low resistance state and a high resistance state that has a higher resistance value than a resistance value of the low resistance state, the writing current or the writing voltage is a forming pulse used in the forming on the variable resistance element in the selected memory cell, and the load current is a current for checking whether application of the forming pulse causes the variable resistance element in the selected memory cell to be in the second resistance state.

13. The method according to claim 9, wherein the variable resistance element is reversibly changeable between the first resistance state and the second resistance state, the writing current or the writing voltage is an electrical signal that causes the variable resistance element in the selected memory cell to be reversibly changeable between the first resistance state and the second resistance state, and the load current is a current for checking whether the variable resistance element in the selected memory cell is in the first resistance state or in the second resistance state.

14. The method according to claim 9, wherein each of the memory cells includes the variable resistance element and a diode element which are connected in series with each other, the diode element comprising a nitrogen-deficient silicon nitride film.

* * * * *